US011626479B2

(12) United States Patent
Takemoto et al.

(10) Patent No.: US 11,626,479 B2
(45) Date of Patent: Apr. 11, 2023

(54) SEMICONDUCTOR DEVICE AND METHOD OF MANUFACTURING SEMICONDUCTOR DEVICE

(71) Applicant: SHINDENGEN ELECTRIC MANUFACTURING CO., LTD., Tokyo (JP)

(72) Inventors: Gotaro Takemoto, Saitama (JP); Toshihiro Okuda, Saitama (JP); Mizue Kitada, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/892,286

(22) Filed: Jun. 4, 2020

(65) Prior Publication Data
US 2020/0388671 A1    Dec. 10, 2020

(30) Foreign Application Priority Data
Jun. 7, 2019   (JP) .............................. JP2019-107523

(51) Int. Cl.
*H01L 29/06*   (2006.01)
*H01L 29/78*   (2006.01)
(Continued)

(52) U.S. Cl.
CPC ........ *H01L 29/0623* (2013.01); *H01L 29/404* (2013.01); *H01L 29/407* (2013.01);
(Continued)

(58) Field of Classification Search
CPC . H01L 29/404; H01L 29/407; H01L 29/0623; H01L 29/7813
See application file for complete search history.

(56) References Cited

U.S. PATENT DOCUMENTS 6,426,520 B1 * 7/2002 Traijkovic .......... H01L 29/0619
257/107
8,080,858 B2   12/2011 Hirler et al.
(Continued)

FOREIGN PATENT DOCUMENTS

CN    106024863 A    10/2016
JP    2006128507 A    5/2006
(Continued)

*Primary Examiner* — Vincent Wall
(74) *Attorney, Agent, or Firm* — Hauptman Ham, LLP

(57) ABSTRACT

A semiconductor device includes: a semiconductor base substrate including a semiconductor layer; a first main electrode; a second main electrode; a plurality of peripheral trenches formed on a surface of the semiconductor layer and having bottom portions covered by the semiconductor layer in a peripheral region; and a plurality of in-trench electrodes each embedded in each of the plurality of peripheral trenches byway of an insulation layer formed on an inner surface of the each peripheral trench, wherein the semiconductor base substrate further includes, in the peripheral region, a plurality of second conductive type floating regions disposed in the semiconductor layer at a depth position deeper than the bottom portions of the peripheral trenches in a spaced apart manner from the peripheral trenches and having a potential in a floating state.

19 Claims, 20 Drawing Sheets

(51) Int. Cl.
*H01L 29/66* (2006.01)
*H01L 29/40* (2006.01)

(52) U.S. Cl.
CPC .... *H01L 29/66734* (2013.01); *H01L 29/7811* (2013.01); *H01L 29/7813* (2013.01)

(56) References Cited

U.S. PATENT DOCUMENTS

| | | | |
|---|---|---|---|
| 9,362,352 B2 * | 6/2016 | Yoshimochi | H01L 27/0629 |
| 9,583,578 B2 * | 2/2017 | Schulze | H01L 29/7811 |
| 2005/0161732 A1 * | 7/2005 | Mizukami | H01L 29/0634 |
| | | | 257/E29.313 |
| 2008/0087951 A1 | 4/2008 | Takaya et al. | |
| 2008/0258208 A1 * | 10/2008 | Hirler | H01L 29/7816 |
| | | | 257/493 |
| 2011/0001189 A1 | 1/2011 | Challa et al. | |
| 2011/0136310 A1 | 6/2011 | Grivna | |
| 2012/0217577 A1 | 8/2012 | Hashimoto et al. | |
| 2013/0020671 A1 | 1/2013 | Lee et al. | |
| 2014/0027840 A1 | 1/2014 | Guan et al. | |
| 2015/0084124 A1 * | 3/2015 | Saito | H01L 29/7397 |
| | | | 257/330 |
| 2015/0372128 A1 | 12/2015 | Wada et al. | |
| 2016/0211319 A1 | 7/2016 | Saito et al. | |

FOREIGN PATENT DOCUMENTS

| | | |
|---|---|---|
| JP | 2012178389 A | 9/2012 |
| JP | 5089284 B2 | 12/2012 |
| JP | 201369866 A | 4/2013 |
| JP | 2014139967 A | 7/2014 |
| JP | 201565237 A | 4/2015 |
| JP | 201565238 A | 4/2015 |
| JP | 2016189368 A | 11/2016 |
| JP | 201769464 A | 4/2017 |
| TW | 201308575 A1 | 2/2013 |
| TW | 201405774 A | 2/2014 |
| TW | 201611125 A | 3/2016 |

* cited by examiner

SEMICONDUCTOR DEVICE AND METHOD OF MANUFACTURING SEMICONDUCTOR DEVICE

RELATED APPLICATIONS

The present application claims priority to Japanese Application Number 2019-107523, filed Jun. 7, 2019, the disclosure of which is hereby incorporated by reference herein in its entirety.

BACKGROUND OF THE INVENTION

1. Field of the Invention

The present invention relates to a semiconductor device and a method of manufacturing a semiconductor device.

2. Description of the Related Art

Conventionally, there has been known a semiconductor device where a p-type guard ring region (FLR region) and a p-type floating region are formed in a peripheral region (conventional semiconductor device 800 (see JP 2015-65238 A, for example)).

As shown in FIG. 20, the conventional semiconductor device 800 includes: a semiconductor base substrate 810 having an n-type semiconductor layer 812; a source electrode 830 (first main electrode) formed on one surface side of the semiconductor base substrate 810; a drain electrode 840 (second main electrode) formed on the other surface side of the semiconductor base substrate 810. The semiconductor base substrate 810 further includes, in a peripheral region A2 outside an active region A1 where a main current path is formed between the source electrode 830 and the drain electrode 840, a plurality of p-type guard ring regions 815 formed on a surface of the semiconductor layer 812 and a plurality of p-type floating regions 816 formed at a position spaced apart from the p-type guard ring regions 815.

The conventional semiconductor device 800 includes the plurality of p-type guard ring regions 815 formed on the surface of the semiconductor layer 812 and the plurality of p-type floating regions 816 formed at the position spaced apart from the p-type guard ring regions 815 in the peripheral region A2. Accordingly, by extending a depletion layer from both the guard ring regions 815 formed on the surface of the semiconductor base substrate 810 and the floating regions 816 disposed in the inside of the semiconductor base substrate 810, equipotential lines extending from the inside of the semiconductor base substrate 810 to the surface of the semiconductor base substrate 810 is distributed uniformly and hence, an electric field intensity from the inside of the semiconductor base substrate 810 to the surface of the semiconductor base substrate 810 can be reduced.

Recently, along with the progress in the field of electric equipment, there arises a demand for a semiconductor device having a large rated current which is used in an electric equipment (a power source apparatus or the like) which allows the conduction of a large electric current. As a result, a semiconductor device having a higher withstand voltage is requested.

In the conventional semiconductor device 800, a withstand voltage is increased using a plurality of p-type guard ring regions 815 formed on the surface of the semiconductor layer 812. However, a dielectric constant of silicon which is a material for forming the semiconductor is limited and hence, the increase of the withstand voltage of the semiconductor device is limited whereby it is difficult to satisfy a request for a semiconductor device having a higher withstand voltage.

In view of the above-mentioned circumstances, conventionally, there has been proposed a semiconductor device which includes a peripheral trench and p-type floating regions which are disposed adjacently to (in contact with) a bottom portion of the peripheral trench in a peripheral region (other conventional semiconductor device 900 (see JP 5089284 B, for example)).

As shown in FIG. 21, the other conventional semiconductor device 900 includes: a semiconductor base substrate 910 having an n-type semiconductor layer 912; a source electrode 930 (first main electrode) formed on one surface side of the semiconductor base substrate 910; a drain electrode D (second main electrode) formed on the other surface side of the semiconductor base substrate 910, a plurality of peripheral trenches 960 formed on a surface of the semiconductor layer 912 in a peripheral region A2 outside an active region A1 where a main current path is formed between the source electrode 930 and the drain electrode D; and in-trench electrodes 964 embedded in the plurality of peripheral trenches 960 by way of insulation layers 962 formed on respective inner surfaces of the peripheral trenches 960. The semiconductor base substrate 910 further includes: in the peripheral region A2, a plurality of p-type floating regions 916 which are disposed in the semiconductor layer 912 at a position disposed adjacently to bottom portions of the peripheral trenches 960 and have a potential in a floating state.

As shown in FIG. 22A to FIG. 22F, it is considered that the other conventional semiconductor device 900 is manufactured in accordance with a following method. That is, the method of manufacturing the other conventional semiconductor device includes: a step of preparing a low resistance semiconductor layer 911 (see FIG. 22A); a step of forming an n-type semiconductor layer 912 on the low resistance semiconductor layer 911 (see FIG. 22B); a step of forming a peripheral trench 960 in a predetermined region of a surface of the semiconductor layer 912 in a region which is defined as the peripheral region A2 after manufacturing of the semiconductor device (see FIG. 22C); a step of introducing a p-type dopants toward a bottom portion of the peripheral trench 960 (for example, ion implantation) (see FIG. 22D); a step of forming a p-type floating region 916 by activating p-type dopants (see FIG. 22E); and a step of forming the insulation layer 962 on the inner surface of the peripheral trench 960 and embedding the in-trench electrode 964 in the peripheral trench 960 by way of the insulation layer 962 (see FIG. 22F) in this order.

The other conventional semiconductor device 900 includes, in the peripheral region A2, the plurality of peripheral trenches 960 formed on the surface of the semiconductor layer 912, and the in-trench electrodes 964 embedded in the plurality of peripheral trenches 960 by way of the insulation layers 962 formed on the respective inner surfaces of the plurality of peripheral trenches 960. Accordingly, it is possible to make a depletion layer progress in the peripheral region A2 before an electric field in an outermost peripheral region of the active region A1 where the concentration of electric field is likely to occur exceeds a critical electric field and hence, the electric field can be received by the insulation layers 962 of the respective peripheral trenches in a sharing manner. Accordingly, a withstand voltage in the peripheral region A2 can be increased.

SUMMARY OF INVENTION

However, in the other conventional semiconductor device 900, the floating regions 916 are disposed adjacently to the peripheral trenches 960 and hence, it is difficult for a depletion layer to extend. Accordingly, it is difficult to increase an electric field reducing effect at the bottom portions of the peripheral trenches thus giving rise to a drawback that it is difficult to further increase a withstand voltage in the peripheral region A2.

Inventors of the present invention have made extensive studies on a withstand voltage in the peripheral region A2 and, as a result, have found that there also exists a drawback that when the bottom portion of the peripheral trench 960 and the p-type floating region 916 are disposed adjacently to each other, a withstand voltage in the peripheral region A2 is largely lowered when irregularities occur in the number of carriers (dose amount) in the floating region 916 (see FIG. 6 to FIG. 10 described later).

In view of the above circumstances, the present invention has been made to overcome the above-mentioned drawbacks, and it is an object of the present invention to provide a semiconductor device which can further increase a withstand voltage in a peripheral region by making lowering of the withstand voltage in the peripheral region difficult even when irregularities occur in the number of carriers (dose amount) of the floating region, and a method of manufacturing such a semiconductor device.

[1] According to an aspect of the present invention, there is provided a semiconductor device (first semiconductor device) which includes: a semiconductor base substrate including a first conductive type semiconductor layer; a first main electrode formed on one surface side of the semiconductor base substrate; a second main electrode formed on the other surface side of the semiconductor base substrate on a side opposite to the one surface; a plurality of peripheral trenches formed on a surface of the semiconductor layer and having bottom portions covered by the semiconductor layer in a peripheral region outside an active region where a main current path is formed between the first main electrode and the second main electrode; and a plurality of in-trench electrodes each embedded in each of the plurality of peripheral trenches by way of an insulation layer formed on an inner surface of the each peripheral trench, wherein the semiconductor base substrate further includes, in the peripheral region, a plurality of second conductive type floating regions disposed in the semiconductor layer at a depth position deeper than the bottom portions of the peripheral trenches in a spaced apart manner from the peripheral trenches and having a potential in a floating state.

[2] According to another aspect of the present invention, there is provided a semiconductor device (second semiconductor device) which includes: a semiconductor base substrate having a first conductive type semiconductor layer; a first main electrode formed on one surface side of the semiconductor base substrate; a second main electrode formed on the other surface side of the semiconductor base substrate on a side opposite to the one surface; a plurality of peripheral trenches formed on a surface of the semiconductor layer and having bottom portions covered by the semiconductor layer in a peripheral region outside an active region where a main current path is formed between the first main electrode and the second main electrode; and a plurality of in-trench electrodes each embedded in each of the plurality of peripheral trenches by way of an insulation layer formed on an inner surface of the each peripheral trench, wherein the semiconductor device further includes, in the active region, a plurality of trenches formed on the semiconductor layer, a plurality of gate electrodes each formed in each of the plurality of trenches by way of a side wall of the trench and a gate insulation film, a plurality of shield electrodes each positioned between a bottom of the trench and the gate electrode, and a plurality of insulation regions each extending between the gate electrode and the shield electrode, and further extending along the side wall and the bottom of the trench thus making the shield electrode spaced apart from the side wall and the bottom, the semiconductor base substrate further includes, in the peripheral region, a single or a plurality of second conductive type floating regions disposed in the semiconductor layer at a depth position deeper than the bottom portions of the peripheral trenches in a spaced apart manner from the peripheral trenches and having a potential in a floating state, the semiconductor base substrate further includes, in the active region, a second conductive type base region formed on a surface of the semiconductor layer and being brought into contact with a side wall of the trench, a first conductive type source region formed on a surface of the base region and being brought into contact with the side wall of the trench, and a boundary floating region disposed in the semiconductor layer at a depth position deeper than a bottom portion of the trench in a spaced-apart manner from the trench and having a potential in a floating state, the boundary floating region being, as viewed in a plan view, disposed between the trench closest to the peripheral region among the plurality of trenches in the active region and the peripheral trench closest to the active region among the plurality of peripheral trenches in the peripheral region.

[3] In the semiconductor device according to the present invention, it is preferable that the semiconductor base substrate include a plurality of the floating regions disposed in a spaced apart manner from each other as the floating regions.

[4] In the semiconductor device according to the present invention, it is preferable that, in the peripheral region, a distance between the peripheral trenches disposed adjacently to each other on an active region side differ from a distance between the peripheral trenches disposed adjacently to each other on an outer peripheral side.

[5] In the semiconductor device according to the present invention, it is preferable that, in the peripheral region, the distance between the peripheral trenches disposed adjacently to each other on the active region side be narrower than the distance between the peripheral trenches disposed adjacently to each other on the outer peripheral side.

[6] In the semiconductor device according to the present invention, it is preferable that the floating region be formed at dopant concentration with which the floating region is completely depleted at the time of applying a reverse bias.

[7] In the semiconductor device according to the present invention, it is preferable that the plurality of peripheral trenches are three or more peripheral trenches, and the in-trench electrode in at least two peripheral trenches on the active region side among the plurality of peripheral trenches be connected with the first main electrode.

[8] In the semiconductor device according to the present invention, it is preferable that the floating regions be disposed in a region where the peripheral trenches are disposed as viewed in a plan view.

The term "region where the peripheral trenches are disposed" means, in the peripheral region, a region between the peripheral trench disposed closest to an active region side and the peripheral trench disposed on an outermost side.

[9] In the semiconductor device according to the present invention, it is preferable that the floating region be disposed also outside the region where the peripheral trenches are disposed as viewed in the plan view.

[10] In the semiconductor device according to the present invention, it is preferable that the floating region be disposed between the peripheral trenches as viewed in a plan view.
[11] In the semiconductor device according to the present invention, it is preferable that the floating region be disposed just below the peripheral trench.
[12] In the semiconductor device according to the present invention, it is preferable that a depth of the peripheral trench be equal to a depth of the trench.
[13] In the semiconductor device according to the present invention, it is preferable that a depth of the peripheral trench be larger than a depth of the trench.
[14] In the semiconductor device according to the present invention, it is preferable that the semiconductor base substrate further include, on a surface of the semiconductor layer in the peripheral region, a second conductive type surface semiconductor layer disposed at least one portion between the peripheral trenches disposed adjacently to each other and having higher dopant concentration than the floating region.
[15] According to another aspect of the present invention, there is provided a method of manufacturing a semiconductor device for manufacturing the semiconductor device described in the above-mentioned [1] to [14], the method includes: a first semiconductor layer forming step of forming a first conductive type first semiconductor layer having a predetermined thickness by an epitaxial growth method; a second conductive type dopant introducing step of introducing a second conductive type dopant in the first semiconductor layer or on a surface of the first semiconductor layer in a predetermined region of a region defined as a peripheral region disposed outside an active region after manufacturing of the semiconductor device; a second semiconductor layer forming step of forming a first conductive type second semiconductor layer having a predetermined thickness by an epitaxial growth method on the first semiconductor layer into which the second conductive type dopant is introduced; a peripheral trench forming step of forming a peripheral trench disposed at a position shallower than a depth position at which the second conductive type dopant is introduced in a predetermined region of the surface of the second semiconductor layer in a region which is defined as the peripheral region after manufacturing of the semiconductor device; an in-trench electrode forming step of forming an insulation layer on an inner surface of the peripheral trench and forming an in-trench electrode in the peripheral trench by way of the insulation layer; a main electrode forming step including a step of forming a first main electrode on a surface side of the second semiconductor layer and a step of forming a second main electrode on a surface side of the first semiconductor layer, wherein the method of manufacturing a semiconductor device further includes: a floating region forming step of forming a floating region using the second conductive type dopant between the second conductive type dopant introducing step and the main electrode forming step.

According to the semiconductor devices (the first semiconductor device and the second semiconductor device) of the present invention, the semiconductor base substrate includes, in the peripheral region, the second conductive type floating regions which are disposed in the semiconductor layer at a depth position deeper than the bottom portions of the peripheral trenches in a spaced-apart manner from the peripheral trenches and have a potential in a floating state. With such a configuration, a depletion layer extends in both directions, that is, in a depth direction from the floating regions to the peripheral trenches and in a depth direction away from the peripheral trenches. Accordingly, the depletion layer is formed with a large thickness compared to the other conventional semiconductor device 900 and hence, an electric field reduction effect at the bottom portions of the peripheral trenches can be increased. As a result, a withstand voltage in the peripheral region can be further increased.

Further, according to the semiconductor device of the present invention, the semiconductor base substrate includes, in the peripheral region, the second conductive type floating regions which are disposed in the semiconductor layer at a depth position deeper than the bottom portions of the peripheral trenches in a spaced-apart manner from the peripheral trenches and have a potential in a floating state. Accordingly, the floating regions can be arranged without receiving a restriction on the arrangement position of the peripheral trenches. Accordingly, it is possible to provide a semiconductor device which has a high degree of freedom in designing, and can easily cope with a change in designing.

Further, according to the semiconductor device of the present invention, the semiconductor base substrate includes, in the peripheral region, the second conductive type floating regions which are disposed in the semiconductor layer at a depth position deeper than the bottom portions of the peripheral trenches in a spaced-apart manner from the peripheral trenches and have a potential in a floating state. Accordingly, it is possible to acquire the following advantageous effects (1) to (3). (1) Unlike the case where a process is performed where ion implantation is applied to the bottom portions of the peripheral trenches, there is no possibility that irregularities occur in the number of carriers (dose amount) in the floating regions depending on an angle of ion implantation applied to the bottom portions of the peripheral trenches. (2) Further, even when irregularities occur in the number of carriers (dose amount) in the floating regions due to other factors, it is possible to prevent a withstand voltage in the peripheral region from being largely lowered. (3) Still further, a large dose margin can be obtained (see FIG. 6 to FIG. 10).

In this specification, "reference dose amount" is a dose amount in the floating region when a withstand voltage becomes a peak and is set as "1". Further, "dose margin" means a range of "reference dose amount" when a withstand voltage BVdss becomes a predetermined value or more.

In the semiconductor device described in JP 2015-65238 A, equipotential lines in the semiconductor base substrate are uniformly arranged by making a depletion layer extend from both sides, that is, from an FLR region (guard ring region) on an upper surface and the floating region inside the semiconductor base substrate thus reducing an intensity of an electric field in the semiconductor base substrate and the upper portion of the semiconductor base substrate. However, a dielectric constant of silicon which is a material for forming the semiconductor has a limit and hence, it is difficult to satisfy a demand for a semiconductor device having a higher withstand voltage.

The floating region of the semiconductor device described in JP 2015-65238 A has a function of extending the depletion layer in a flat shape in a depth direction in such a manner that the depletion layer extending in a direction from the floating region to a surface (a surface on a source electrode side) of the semiconductor base substrate is connected to a depletion layer extending from the FLR region in the depth direction so that the floating region itself is completely depleted. Further, unlike the present invention, the semiconductor device does not include the peripheral trench so that the semiconductor device does not adopt the structure where a withstand voltage is ensured by making the insulation layer of the peripheral trench partially hold a divided voltage.

Accordingly, the floating region of the semiconductor device described in JP 2015-65238 A fundamentally does not have a drawback that an electric field is liable to be concentrated on a corner portion of a bottom portion of the peripheral trench. That is, the function of the floating region of the semiconductor device described in JP 2015-65238 A has a function largely different from the function of the floating region of the present invention which increases an electric field reduction effect at the bottom portion of the peripheral trench (attenuates the electric field of the bottom portion of the peripheral trench).

The method of manufacturing a semiconductor device according to the present invention includes: the first semiconductor layer forming step; the second conductive type dopant introducing step of introducing the second conductive type dopant in the first semiconductor layer or on the surface of the first semiconductor layer; the second semiconductor layer forming step; the peripheral trench forming step; and the main electrode forming step, wherein the method of manufacturing a semiconductor device further includes: the floating region forming step of forming the floating region using the second conductive type dopant between the second conductive type dopant introducing step and the main electrode forming step. Accordingly, compared to a process where a dopant is introduced into the bottom portions of the peripheral trenches, even when irregularities occur in an angle of introducing ions, there is no possibility that dopant concentration and a size of the floating region deviate from values at the time of designing. There is also no possibility that coarseness and denseness occur in dopant concentration in the floating regions. Further, irregularities in the number of carriers (dose amount) in the floating regions minimally occur. As a result, it is possible to manufacture a semiconductor device where a withstand voltage in the peripheral region is minimally lowered.

Further, in the method of manufacturing a semiconductor device according to the present invention, the first semiconductor layer forming step, the second conductive type dopant introducing step, the second semiconductor layer forming step, and the peripheral trench forming step are performed in this order. Accordingly, the floating regions can be arranged without receiving a restriction on the arrangement position of the peripheral trenches. Accordingly, it is possible to manufacture a semiconductor device which has a high degree of freedom in designing, and can easily cope with a change in designing.

The method of manufacturing a semiconductor device according to the present invention further includes the peripheral trench forming step of forming the peripheral trench disposed at the position shallower than the depth position at which the second conductive type dopant is introduced in the predetermined region of the surface of the second semiconductor layer in a region which is defined as the peripheral region after manufacturing of the semiconductor device. Accordingly, in the manufactured semiconductor device, the depletion layer extends in both directions, that is, in the depth direction from the floating regions to the peripheral trenches and in a depth direction away from the peripheral trenches. Accordingly, the depletion layer is formed with a large thickness compared to the other conventional semiconductor device and hence, an electric field reduction effect at the bottom portions of the peripheral trenches can be increased. As a result, it is possible to manufacture a semiconductor device where a withstand voltage in the peripheral region can be further increased.

The method of manufacturing a semiconductor device according to the present invention includes: the second conductive type dopant introducing step of introducing the second conductive type dopant in the first semiconductor layer or on the surface of the first semiconductor layer in the predetermined region of the region defined as the peripheral region disposed outside the active region after manufacturing of the semiconductor device; the second semiconductor layer forming step of forming the first conductive type second semiconductor layer having the predetermined thickness by an epitaxial growth method on the first semiconductor layer into which the second conductive type dopant is introduced; the peripheral trench forming step of forming the peripheral trench disposed at the position shallower than the depth position at which the second conductive type dopant is introduced in a predetermined region of the surface of the second semiconductor layer in the region which is defined as the peripheral region after manufacturing of the semiconductor device; the in-trench electrode forming step of forming the insulation layer on the inner surface of the peripheral trench and forming the in-trench electrode in the peripheral trench by way of the insulation layer; the main electrode forming step including the step of forming the first main electrode on the surface side of the second semiconductor layer and the step of forming the second main electrode on the surface side of the first semiconductor layer, wherein the method of manufacturing the semiconductor device further includes: the floating region forming step of forming the floating region using the second conductive type dopant between the second conductive type dopant introducing step and the main electrode forming step. Accordingly, it is possible to acquire the following advantageous effects (1) to (3). (1) Unlike the case where a process is performed where ion implantation is applied to the bottom portions of the peripheral trenches, there is no possibility that irregularities occur in the number of carriers (dose amount) in the floating regions depending on an angle of ion implantation applied to the bottom portions of the peripheral trenches. (2) Further, even when irregularities occur in the number of carriers (dose amount) in the floating regions due to other factors, it is possible to prevent a withstand voltage in the peripheral region from being largely lowered. (3) Still further, a large dose margin can be obtained (see FIG. 6 to FIG. 10).

BRIEF DESCRIPTION OF DRAWINGS

FIG. 1A is a cross-sectional view of the semiconductor device 100 according to the embodiment 1, FIG. 1B is a cross-sectional view taken along a line A-A in FIG. 1A, and FIG. 1C is a cross-sectional view taken along a line B-B in FIG. 1A.

FIG. 2A to FIG. 2D are views showing respective steps of the manufacturing method.

FIG. 3A to FIG. 3D are views showing respective steps of the manufacturing method. In FIG. 3A to FIG. 3D, the illustration of an oxide film and polysilicon on a semiconductor base substrate is omitted.

FIG. 4A to FIG. 4D are views showing respective steps of the manufacturing method.

FIG. 5A to FIG. 5C are views showing respective steps of the manufacturing method.

FIG. 11A is a cross-sectional view of the semiconductor device 101, FIG. 11B is a cross-sectional view taken along a line A-A in FIG. 11A, and FIG. 11C is a cross-sectional view taken along a line B-B in FIG. 11A.

FIG. 12A is a cross-sectional view of the semiconductor device 102, FIG. 12B is a cross-sectional view taken along a line A-A in FIG. 12A, and FIG. 12C is a cross-sectional view taken along a line B-B in FIG. 12A.

FIG. 13A is a cross-sectional view of the semiconductor device 103, FIG. 13B is a cross-sectional view taken along a line A-A in FIG. 13A, and FIG. 13C is a cross-sectional view taken along a line B-B in FIG. 13A. In FIG. 13B, to facilitate the understanding of a positional relationship of floating regions 116, the floating regions 116 just below peripheral trenches 160 are indicated by a solid line, and floating regions 116 each disposed between the peripheral trenches 160 are indicated by a dotted line. That is, the floating regions 116 are not disposed on the cross-section A-A.

FIG. 14A is a cross-sectional view of the semiconductor device 104, FIG. 14B is a cross-sectional view taken along a line A-A in FIG. 14A, and FIG. 14C is a cross-sectional view taken along a line B-B in FIG. 14A.

FIG. 15A is a cross-sectional view of the semiconductor device 105, FIG. 15B is a cross-sectional view taken along a line A-A in FIG. 15A, and FIG. 15C is a cross-sectional view taken along a line B-B in FIG. 15A.

FIG. 16A is a cross-sectional view of the semiconductor device 106, FIG. 16B is a cross-sectional view taken along a line A-A in FIG. 16A, and FIG. 16C is a cross-sectional view taken along a line B-B in FIG. 16A.

FIG. 17A is a cross-sectional view of the semiconductor device 107, FIG. 17B is a cross-sectional view taken along a line A-A in FIG. 17A, and FIG. 17C is a cross-sectional view taken along a line B-B in FIG. 17A.

FIG. 18A is a cross-sectional view of the semiconductor device 108, FIG. 18B is a cross-sectional view taken along a line A-A in FIG. 18A, and FIG. 18C is a cross-sectional view taken along a line B-B in FIG. 18A.

FIG. 19A is a cross-sectional view of the semiconductor device 109, FIG. 19B is a cross-sectional view taken along a line A-A in FIG. 19A, and FIG. 19C is a cross-sectional view taken along a line B-B in FIG. 19A.

In FIG. 20, symbol 811 indicates a low resistance semiconductor layer, symbol 813 indicates base regions, symbol 814 indicates source regions, symbol 817 indicates p regions in an active region A1, symbol 852 indicates gate trenches, symbol 854 indicates gate electrodes, and symbol 858 indicates insulation regions.

In FIG. 21, symbol 911 indicates a low resistance semiconductor layer, symbol 912a indicates a first semiconductor layer, symbol 912b indicates a second semiconductor layer, symbol 913 indicates base regions, symbol 914 indicates source regions, symbol 915 indicates a surface semiconductor layer in a peripheral region, symbol 950 indicates trenches, symbol 952 indicates gate insulation films, symbol 954 indicates gate electrodes, symbol 956 indicates insulation regions, and symbol 958 indicates shield electrodes.

FIG. 22A to FIG. 22F are views showing respective steps of the manufacturing method. In FIG. 22, only a part of a peripheral region A2 is illustrated.

DESCRIPTION OF PREFERRED EMBODIMENTS

Figure 1A:
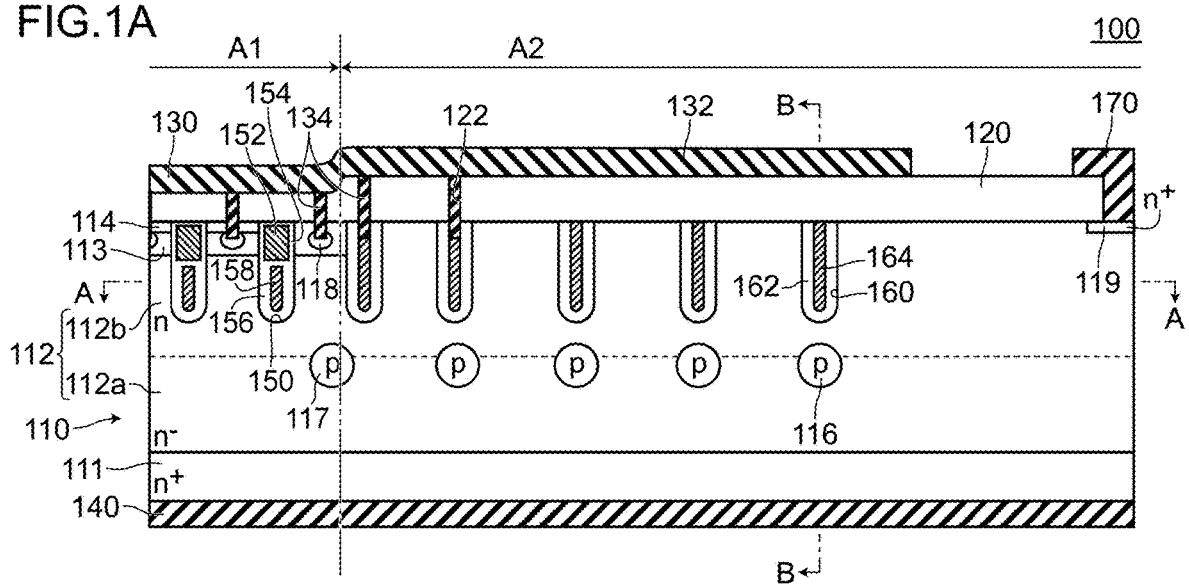
FIG. 1A to FIG. 1C are views showing a semiconductor device 100 according to an embodiment 1.

Hereinafter, a semiconductor device and a method of manufacturing a semiconductor device according to the present invention are described in accordance with embodiments shown in the drawings. The respective drawings are schematic drawings, and do not always strictly reflect actual sizes of configurations. The respective embodiments described hereinafter are not intended to limit the invention relating to Claims. Further, it is not always a case that all of various elements described in the respective embodiments and combinations of these elements are indispensable as means for solving problems of the present invention. In the respective embodiments, constitutional elements basically having the same configurations, technical features and functions (including constitutional elements which are not completely identical with respect to shapes or the like) are indicated by using the same symbols in all embodiments, and the description of these constitutional elements may be omitted. Further, in the respective embodiments, a first conductive type is set as an n-type, and a second conductive type is set as a p-type. However, a first conductive type may be set as a p-type, and a second conductive type may be set as an n-type.

Embodiment 1

1. Configuration of Semiconductor Device 100 According to Embodiment 1

Figure 1B:
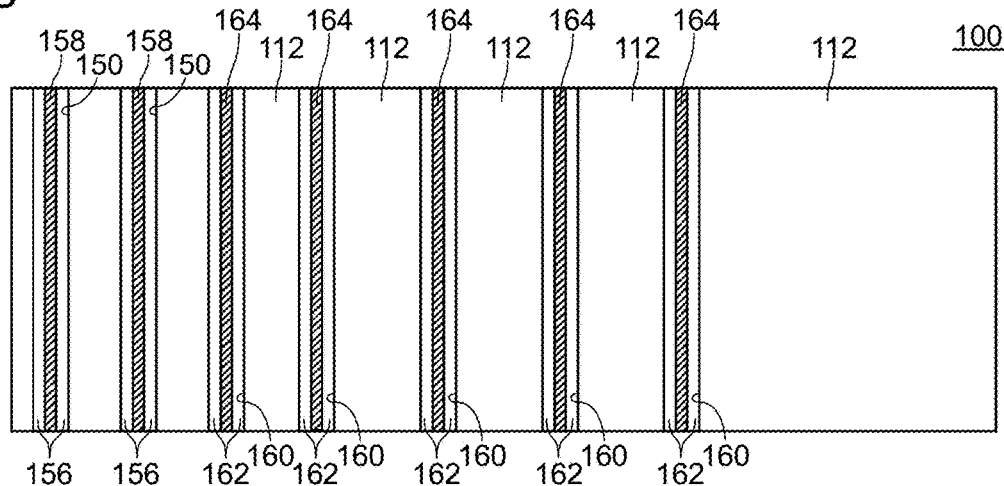
Figure 1C:
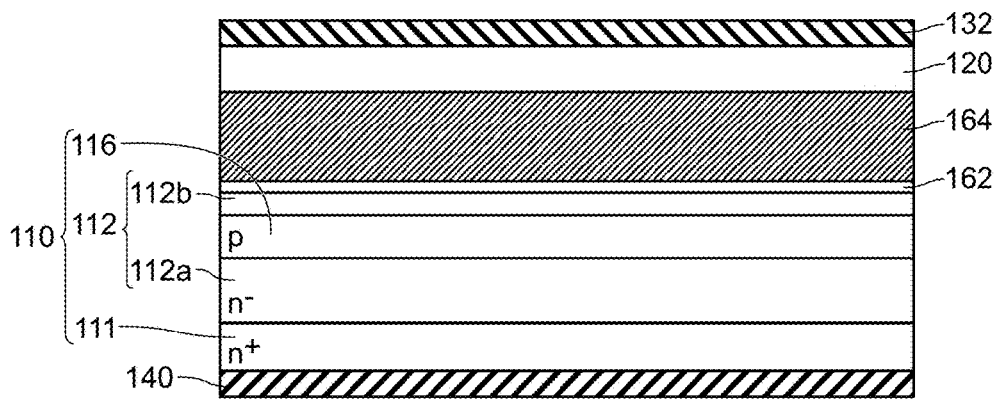

A semiconductor device 100 according to an embodiment 1 is, as shown in FIG. 1A to FIG. 1C, a semiconductor device which includes: a semiconductor base substrate 110 having a drift layer 112; a source electrode 130 (first main electrode) formed on one surface side of the semiconductor base substrate 110 by way of an interlayer insulation film 120; a drain electrode 140 (second main electrode) formed on the other surface side of the semiconductor base substrate 110, wherein an active region A1 where a main current path is formed between the source electrode 130 and the drain electrode 140 and a peripheral region A2 disposed outside the active region A1 are defined.

In the embodiment 1, the semiconductor device 100 includes: in the active region A1, a plurality of trenches 150 formed on the drift layer 112, gate electrodes 152 formed in the plurality of trenches 150 respectively by way of side walls and gate insulation films 154 in the trenches 150; shield electrodes 158 positioned between bottoms of the trenches 150 and the gate electrodes 152; and insulation regions 156 which extend between the gate electrodes 152 and the shield electrodes 158 and further extend along side walls and bottoms of the trenches 150 thus making the shield electrodes 158 spaced apart from the side walls and the bottoms.

The trenches 150 are formed in a region where the drift layer 112 is positioned as viewed in a plan view at a predetermined pitch, and each trench 150 has side walls disposed adjacently to the base region 113 and the source region 114, and a bottom disposed adjacently to the drift layer 112. A depth of the trench 150 is set to a value which falls within a range of from 2.0 µm to 8.0 µm, and is 5 µm, for example.

The gate insulation film 154 is formed of a silicon dioxide film formed by a thermal oxidation method and having a thickness of, for example, 100 nm. The gate electrode 152 and the shield electrode 158 are made of low resistance polysilicon formed by a CVD method or an ion implantation method. A thickness of the insulation region 156 formed between the shield electrode 158 and the drift layer 112 is larger than a thickness of the gate insulation film 154, and is set to, for example, a value which falls within a range of from 0.5 µm to 1.5 µm.

The semiconductor base substrate 110 includes: in the active region A1, an $n^+$-type low resistance semiconductor layer 111, the drift layer 112 (first conductive type semiconductor layer) disposed above the low resistance semiconductor layer 111; p-type base regions 113 formed on a surface of the drift layer 112; n-type source regions 114 disposed on surfaces of the base regions 113; p-type contact regions 118 disposed on the surfaces of the base regions 113 and electrically connected with the source electrode 130 via metal plugs 134 described later; and a boundary floating region 117. One side portion of the source region 114 is disposed adjacently to the trench 150, and the other side portion of the source region 114 is in contact with the metal plug 134. The boundary floating region 117 is described later. The boundary floating region 117 may extend to the peripheral region A2.

The drift layer 112 is formed of an $n^-$-type first semiconductor layer 112a disposed on a low resistance semiconductor layer 111 side, and an n-type second semiconductor layer 112b disposed on a source electrode 130 side.

In the embodiment 1, in the peripheral region A2, the semiconductor device 100 includes: a plurality of peripheral trenches 160 disposed on the surface of the drift layer 112, and each having a bottom portion and side portions which are covered by the drift layer 112 (that is, other elements being not formed in regions of the drift layer 112 which are disposed adjacently to the peripheral trenches 160); in-trench electrodes 164 embedded in the plurality of peripheral trenches 160 byway of insulation layers 162 formed on respective inner surfaces of the peripheral trenches 160; and a channel stop electrode 170 arranged on a surface of the semiconductor base substrate at an outermost peripheral portion of the peripheral region A2.

A depth of the peripheral trench 160 is set equal to the depth of the trench 150. The depth of the peripheral trench 160 is set to a value which falls within a range of from 2.0 µm to 8.0 µm, for example, and is 5 µm, for example. A thickness of the insulation layer 162 is set to a value which falls within a range of from 0.5 µm to 1.5 µm, for example. The in-trench electrode 164 is made of low resistance polysilicon formed by a CVD method or an ion implantation method.

In the peripheral region A2, a distance between two peripheral trenches 160 disposed adjacently to each other on an active region A1 side differs from a distance between the peripheral trenches 160 disposed adjacently to each other on an outer peripheral side (the second peripheral trench 160 counted from the active region A1 side and the peripheral trenches 160 on an outer peripheral side of the second peripheral trench 160). To be more specific, the distance between two peripheral trenches 160 disposed adjacently to each other on the active region A1 side is narrower than the distance between the peripheral trenches 160 disposed adjacently to each other on the outer peripheral side (three peripheral trenches 160 other than two peripheral trenches 160 on the active region A1 side).

Among the plurality of peripheral trenches 160, the in-trench electrodes 164 disposed in two peripheral trenches 160 on the active region A1 side are electrically connected with the source electrode 130 (field plate 132) via the metal plugs 134. Further, among the plurality of peripheral trenches 160, the in-trench electrodes 164 in the peripheral trenches 160 other than two peripheral trenches 160 disposed on the active region A1 side (including the peripheral trench 160 disposed on the outermost peripheral side) are in a state where the in-trench electrodes 164 have a potential in a floating state. Even in a case where these in-trench electrodes 164 are electrically connected with the source electrode 130, it is possible to acquire advantageous effects of the present invention.

In the peripheral region A2, the semiconductor base substrate 110 has a plurality of p-type floating regions 116, and the n-type ($n^+$-type) channel stop region 119 disposed in the vicinity of an outermost periphery of the peripheral region A2.

A thickness of the low resistance semiconductor layer 111 is set to a value which falls within a range of from 100 µm to 400 µm, for example, dopant concentration of the low resistance semiconductor layer 111 is set to a value which falls within a range of from $1\times10^{19}$ cm$^{-3}$ to $1\times10^{20}$ cm$^{-3}$, for example. A thickness of the drift layer 112 is set to a value which falls within a range of from 5 µm to 120 µm, for example. Dopant concentration of the drift layer 112 is set to a value which falls within a range of from $5\times10^{13}$ cm$^{-3}$ to $1\times10^{16}$ cm$^{-3}$, for example. A depth position of a lowermost portion of the base region 113 is set to a value which falls within a range of from 0.5 µm to 4.0 µm, for example, and dopant concentration of the base region 113 is set to a value which falls within a range of from $5 \times 10^{16}$ cm$^{-3}$ to $1 \times 10^{18}$ cm$^{-3}$, for example. A depth position of a deepest portion of the source region 114 is set to a value which falls within a range of from 0.1 μm to 0.4 μm, for example, and dopant concentration of the source region 114 is set to a value which falls within a range of from $5 \times 10^{19}$ cm$^{-3}$ to $2 \times 10^{20}$ cm$^{-3}$, for example.

The trenches 150, the peripheral trenches 160, the base regions 113, and the source regions 114 are formed in a stripe shape (see FIG. 1B).

Next, the floating regions 116 and the boundary floating region 117 are described.

The semiconductor base substrate 110 includes, in the peripheral region A2, the plurality of p-type floating regions 116 which are disposed in the drift layer 112 at a depth position deeper than bottom portions of the peripheral trenches 160 in a spaced-apart manner from the peripheral trenches 160 and have a potential in a floating state.

The semiconductor base substrate 110 includes the boundary floating region 117 which is disposed in the drift layer 112 at a depth position deeper than a bottom portion of the trench 150 in a spaced-apart manner from the trench 150 and has a potential in a floating state. The boundary floating region 117 is, as viewed in a plan view, disposed between the trench 150 closest to the peripheral region A2 among the plurality of trenches 150 in the active region A1 and the peripheral trench 160 closest to the active region A1 among the plurality of peripheral trenches 160 in the peripheral region A2.

The plurality of floating regions 116 are disposed in a spaced-apart manner from each other, and the floating region 116 and the boundary floating region 117 are also disposed in a spaced-apart manner from each other. The floating regions 116 are formed at the same distance as a distance between the peripheral trenches 160 disposed adjacently to each other on the outer peripheral side of the peripheral region A2 (a distance between the peripheral trenches 160 disposed adjacently to each other outside the second peripheral trench 160 counted from the active region A1 side). Accordingly, although the floating regions 116 are formed just below the peripheral trenches (on the outer peripheral side of the peripheral region A2) other than the peripheral trench 160 on the most active region A1 side, the floating region 116 is not formed just below the peripheral trench 160 on the most active region A1 side.

The floating regions 116 and the boundary floating region 117 are formed at dopant concentration with which the floating regions 116 and the boundary floating region 117 are completely depleted at the time of applying a reverse bias.

An interlayer insulation film 120 is formed on one surface of the semiconductor base substrate 110 in a state where the interlayer insulation film 120 extends over both the active region A1 and the peripheral region A2. In the active region A1, as viewed in a plan view, a contact hole 122 which is brought into contact with the source region 114 and the contact region 118 is formed in the interlayer insulation film 120 between the trenches 150. In the peripheral region A2, contact holes 122 which are brought into contact with the in-trench electrodes 164 disposed in two peripheral trenches 160 on the active region A1 side are formed in the interlayer insulation film 120. The interlayer insulation film 120 is formed of a PSG film formed by a CVD method and having a thickness of 1000 mm, for example.

A barrier metal (not shown in the drawings) is formed on an inner surface of the contact hole 122, and the metal plug 134 is formed by filling predetermined metal in the contact hole 122 through the barrier metal. The predetermined metal is tungsten, for example.

The source electrode 130 is disposed on one surface of the semiconductor base substrate 110 by way of the interlayer insulation film 120. The source electrode 130 is electrically connected with the source regions 114, the contact regions 118, and the in-trench electrodes 164 disposed in two peripheral trenches 160 on the active region A1 side via the metal plugs 134. Further, the source electrode 130 is also electrically connected with the shield electrodes 158 at predetermined positions not shown in the drawings. The source electrode 130 is made of aluminum-based metal (for example, Al—Cu based alloy) formed by a sputtering method and having a thickness of 4 μm, for example.

The source electrode 130 extends over not only the active region A1 but also the peripheral region A2, and a portion of the source electrode 130 which extends over the peripheral region A2 forms the field plate 132. That is, the portion of the source electrode 130 forms the field plate 132. A length of the field plate 132 may be set to a suitable length provided that the field plate 132 is not brought into contact with the channel stop electrode 170 on an outermost side.

The drain electrode 140 is formed on a surface of the low resistance semiconductor layer 111. The drain electrode 140 is formed of a multi-layered metal film such as a Ti—Ni—Au film. An entire thickness of the multi-layered metal film is set to 0.5 μm, for example.

2. Method of Manufacturing Semiconductor Device According to Embodiment 1

The method of manufacturing a semiconductor device according to the embodiment 1 includes: a first semiconductor layer forming step; a second conductive type dopant introducing step; a second semiconductor layer forming step; a trench and peripheral trench forming step; a floating region, in-trench electrode, gate electrode, and shield electrode forming step; a base region and source region forming step; an interlayer insulation film forming step; a metal plug forming step; and a main electrode forming step (a source electrode forming step and a drain electrode forming step) (see FIG. 2A to FIG. 2D, FIG. 3A to FIG. 3D, FIG. 4A to FIG. 4D, and FIG. 5A to FIG. 5C).

(1) First Semiconductor Layer Forming Step

Figure 2A:
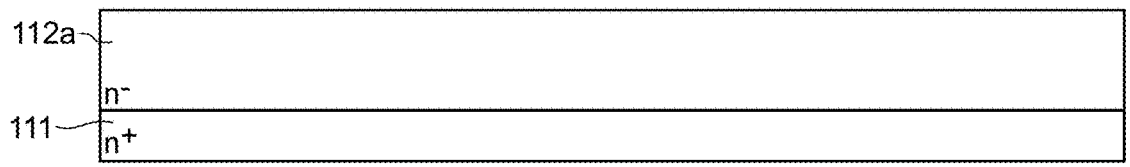
FIG. 2A to FIG. 2D are views showing a method of manufacturing the semiconductor device according to the embodiment 1.

First, an n$^-$-type first semiconductor layer 112a having a predetermined thickness is formed on an n$^+$-type low resistance semiconductor layer 111 by an epitaxial growth method (see FIG. 2A). A thickness of the first semiconductor layer 112a is, for example, substantially a half of a thickness of a drift layer 112 after manufacturing of the semiconductor device.

(2) Second Conductive Type Dopant Introducing Step

Next, a p-type dopant is introduced into a first semiconductor layer 112a in predetermined regions among the regions defined as an active region A1 and a peripheral region A2 after manufacturing of the semiconductor device.

Figure 2B:
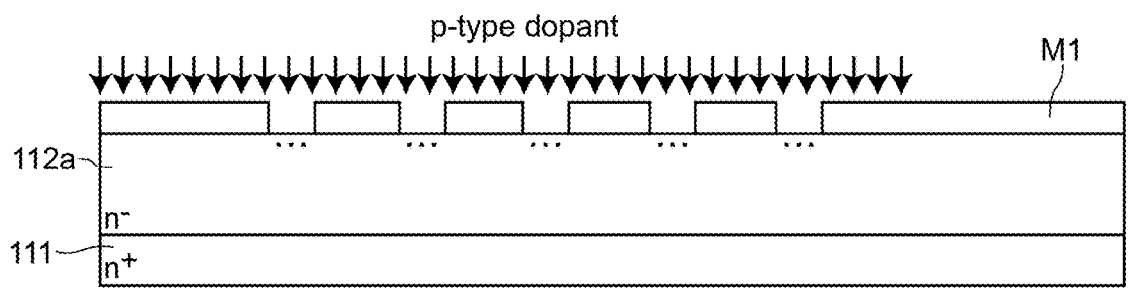

To be more specific, a mask M1 having openings which correspond to floating regions 116 and boundary floating region 117 respectively is formed on the first semiconductor layer 112a, and a p-type dopant (for example, boron) is introduced by ion implantation (high speed ion implantation) through the mask M1 (see FIG. 2B). Next, the mask M1 is removed from a surface of the first semiconductor layer 112a.

(3) Second Semiconductor Layer Forming Step

Figure 2C:
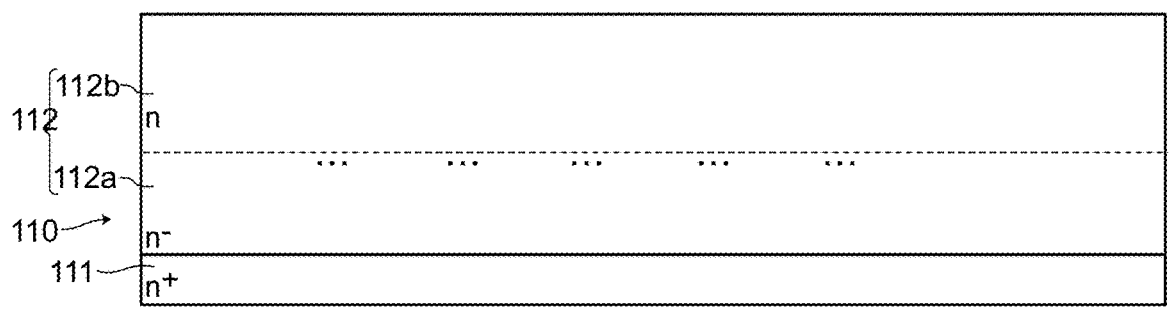
Figure 2D:
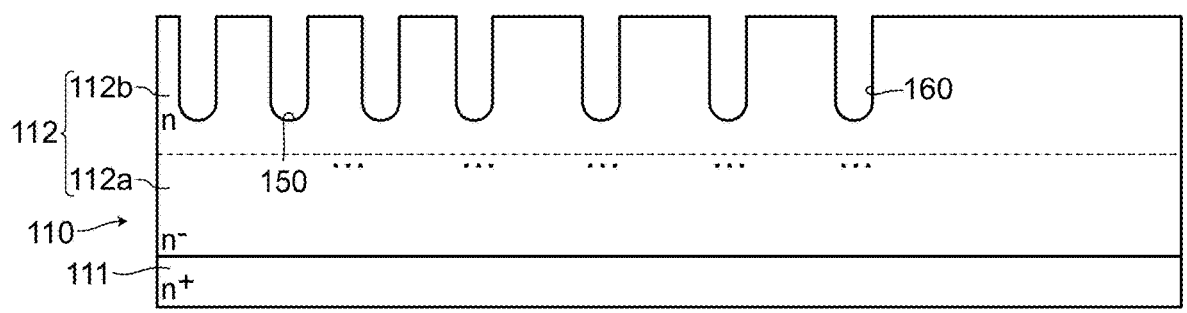

Next, an n-type second semiconductor layer 112b having a predetermined thickness is formed by an epitaxial growth method on the first semiconductor layer 112a into which a p-type dopant is introduced (see FIG. 2C). The first semiconductor layer 112a and the second semiconductor layer 112b form the drift layer 112.

(4) Trench and Peripheral Trench Forming Step

Next, a mask (not shown in the drawings) having openings which correspond to the trenches 150 in the active region A1 and the peripheral trenches 160 in the peripheral region A2 is formed on a surface of the drift layer 112. The plurality of trenches 150 and the plurality of peripheral trenches 160 are formed on the drift layer 112 by etching using the mask (see FIG. 2D). After such etching, the mask is removed, and inner surfaces of the trenches 150 and the peripheral trenches 160 are made smooth by sacrificial oxidation. With respect to the peripheral trenches 160, a distance between two peripheral trenches 160 disposed adjacently to each other on a region side which forms the active region A1 is narrower than a distance between the peripheral trenches 160 disposed adjacently to each other on an outer peripheral side.

Figure 3A:
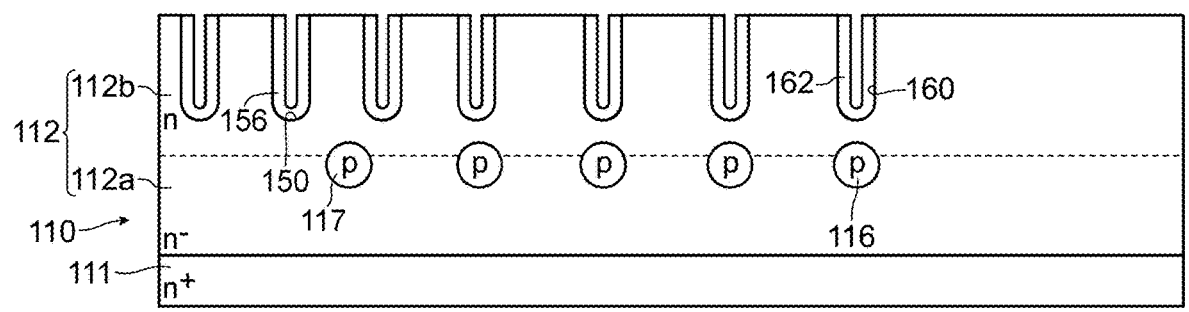
FIG. 3A to FIG. 3D are views showing the method of manufacturing the semiconductor device according to the embodiment 1.

(5) Floating Region, in-Trench Electrode, Gate Electrode, and Shield Electrode Forming Step An oxide film is formed on a surface of the semiconductor base substrate 110 including the inner peripheral surfaces of the trenches 150 and the inner peripheral surfaces of the peripheral trenches 160 (see FIG. 3A). At this stage of processing, an oxide film formed on the inner peripheral surface of the peripheral trench 160 forms the insulation layer 162, and the oxide film formed on the inner peripheral surface of the trench 150 forms a portion of the insulation region 156. Further, at this stage of processing, a p-type dopant in the first semiconductor layer 112a is activated so that the p-type floating regions 116 and the boundary floating region 117 are formed.

Figure 3B:
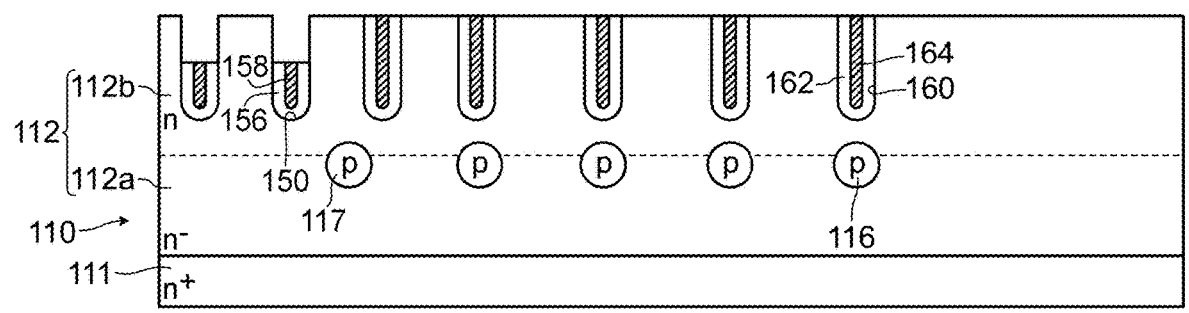

Next, polysilicon is deposited on the oxide film (insulation layer 162) (see FIG. 3B). With such processing, the polysilicon in the peripheral trench 160 forms an in-trench electrode 164. At this stage of processing, an n-type dopant (phosphorus, for example) may be thermally diffused by ion implantation so as to lower a resistance of the polysilicon. Next, the polysilicon and the oxide films in regions other than the trenches 150 and the peripheral trenches 160 and the polysilicon and the oxide films disposed at upper portions of the trenches 150 are removed by etching. With such processing, the polysilicon in the trenches 150 form the shield electrodes 158.

Figure 3C:
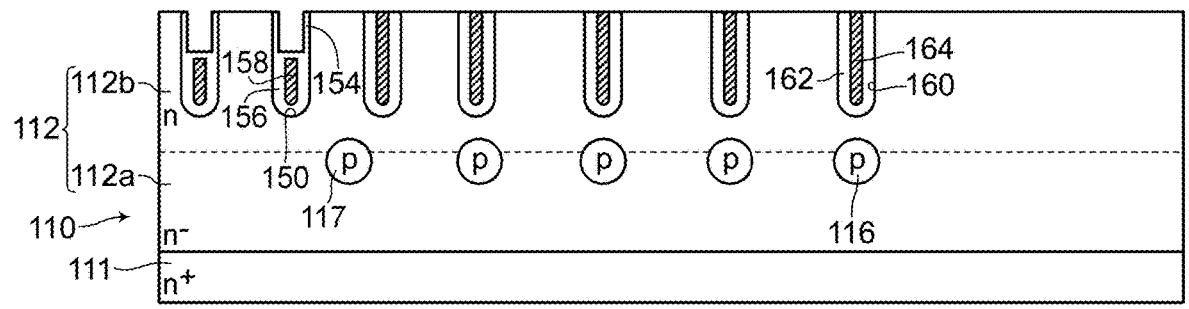
Figure 3D:
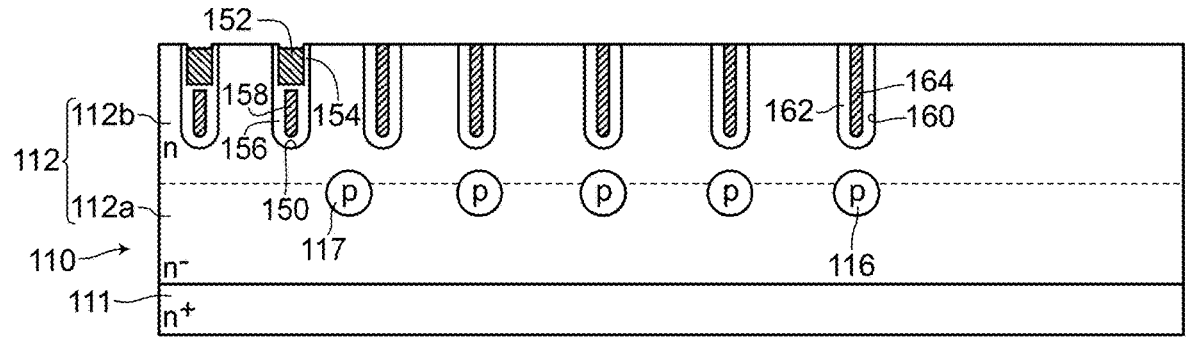

Next, by a thermal oxidization method, the gate insulation film 154 is formed on side walls of the trench 150 and a part of the insulation region 156 which isolates the shield electrode 158 and the gate electrode from each other is formed (see FIG. 3C). Next, by a CVD method, polysilicon is deposited in the trench 150 thus forming the gate electrode 152 (see FIG. 3D).

(6) Base Region and Source Region Forming Step

Figure 4A:
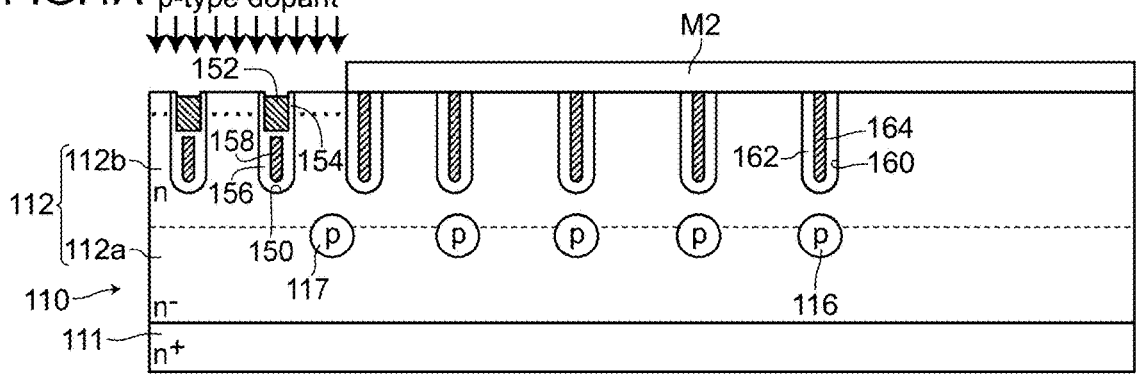
FIG. 4A to FIG. 4D are views showing the method of manufacturing the semiconductor device according to the embodiment 1.
Figure 4B:
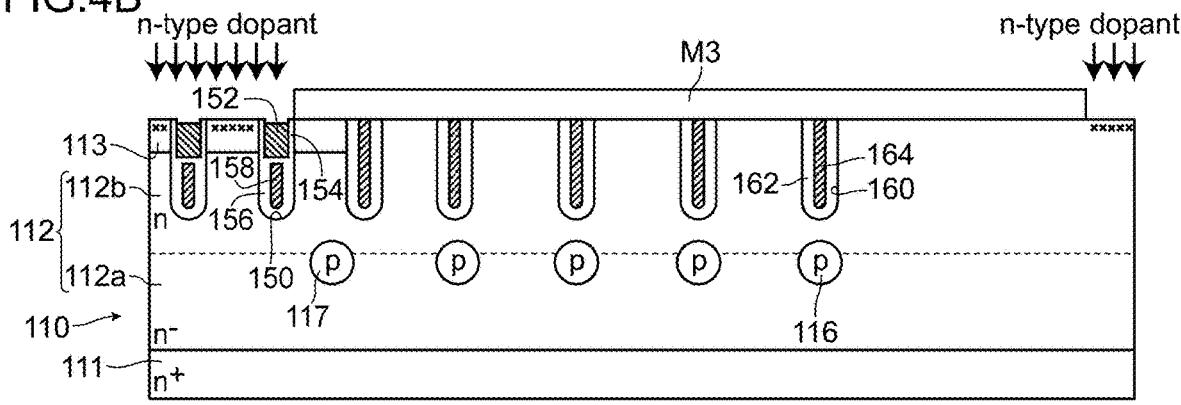
Figure 4C:
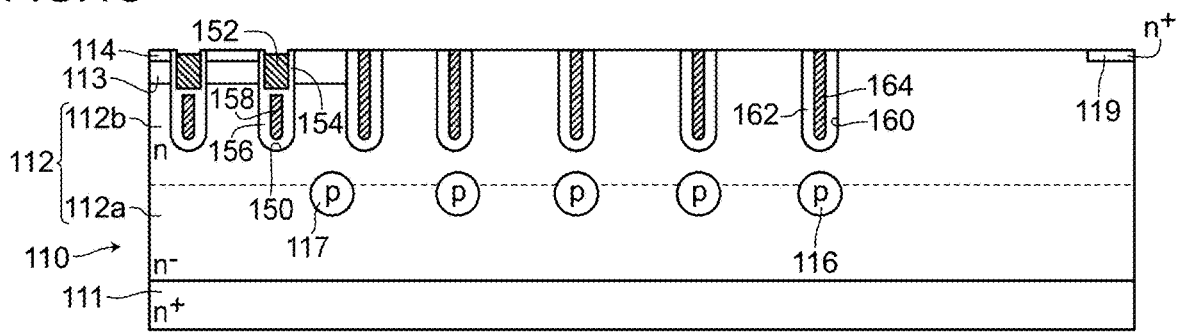

Next, a mask M2 having openings corresponding to the base regions 113 is formed, and a p-type dopant (for example, boron) is introduced by ion implantation into a surface of the drift layer 112 in the active region A1 through the mask M2 (see FIG. 4A). Next, the mask M2 is removed, and the p-type dopant introduced into the drift layer 112 by ion implantation is activated so that the base regions 113 are formed. Next, a mask M3 having openings corresponding to source regions 114 and a channel stop region 119 is formed on the drift layer 112, and an n-type dopant (for example, arsenic) is introduced into the drift layer 112 through the mask M3 by ion implantation (see FIG. 4B). Next, the mask M3 is removed, and the n-type dopant introduced into the drift layer 112 by ion implantation is activated so that the source regions 14 and the channel stop region 119 are formed (see FIG. 4C).

(7) Interlayer Insulation Film and Metal Plug Forming Step

Figure 4D:
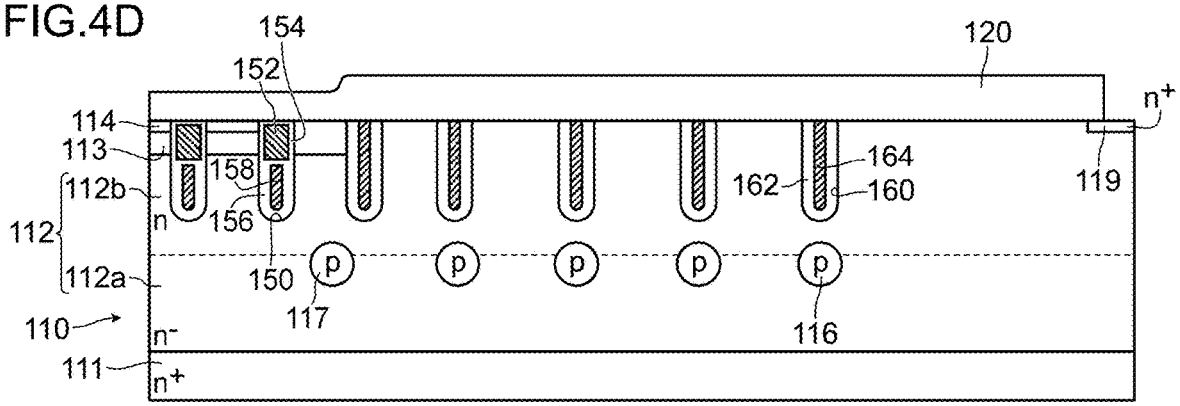

Next, an interlayer insulation film 120 is formed on a surface of a one surface side (a surface on which the drift layer 112 is formed) of the semiconductor base substrate 110 (see FIG. 4D). Next, contact holes 122 are formed in the interlayer insulation film 120 at predetermined positions (see FIG. 5A). Next, in the active region A1, the semiconductor base substrate 110 is dug by etching through the contact holes 122. Further, in the peripheral region A2, the in-trench electrodes 164 are dug by etching through the contact holes 122.

Next, in the active region A1, a p-type dopant is introduced (introduced by ion implantation) into bottom portions of the contact holes 122 using the interlayer insulation film 120 as a mask. Next, the p-type dopant is activated so that p-type contact regions 118 are formed. Next, in the active region A1 and the peripheral region A2, barrier metal (not shown in the drawings) is formed on inner surfaces of the contact holes 122, and predetermined metal is filled in the contact holes 122 by way of the barrier metal. With such processing, the metal plugs 134 are formed (see FIG. 5B).

(8) Main Electrode Forming Step (Source Electrode Forming Step and Drain Electrode Forming Step)

Figure 5A:
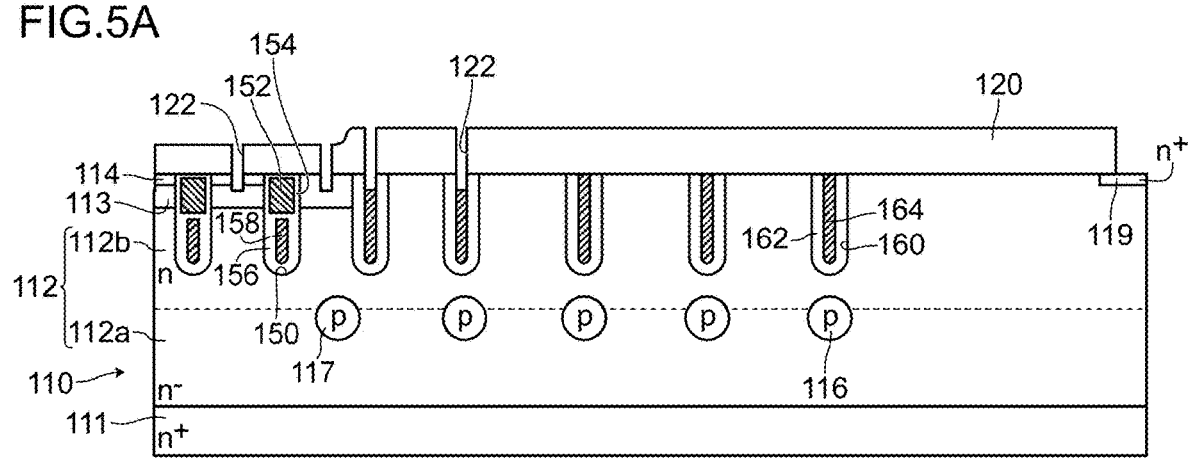
FIG. 5A to FIG. 5C are views showing the method of manufacturing the semiconductor device according to the embodiment 1.
Figure 5B:
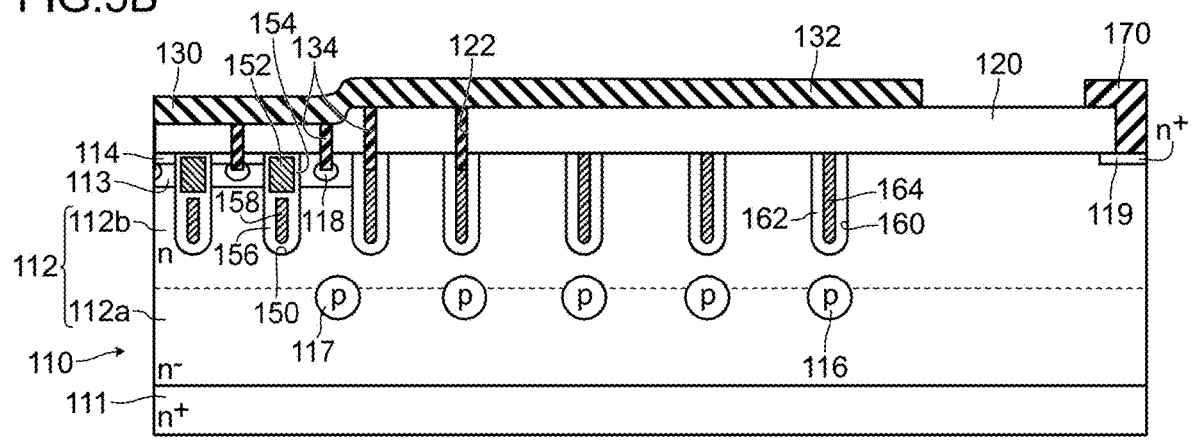
Figure 5C:
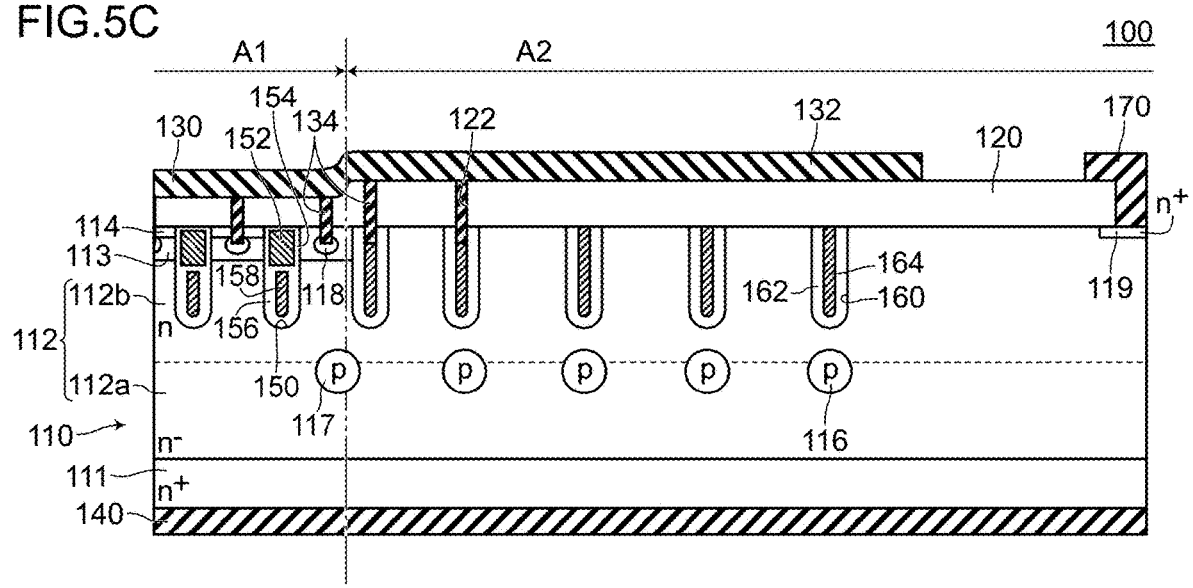

Next, an Al—Cu based metal film is formed on the interlayer insulation film 120 by sputtering method so that the source electrode 130 is formed (see FIG. 5B). The source electrode 130 is formed such that the source electrode 130 covers the entire active region A1 and extends over the peripheral region A2 to a predetermined position. A metal film in the peripheral region A2 plays the role of a field plate (see symbol 132 in FIG. 5B). Further, a multi-layered metal film such as a Ti—Ni—Au film is formed on the low resistance semiconductor layer 111 so that a drain electrode 140 is formed (see FIG. 5C).

In accordance with such steps, it is possible to manufacture the semiconductor device 100 according to the embodiment 1.

3. Test Examples

Test examples are test examples for proving that "the semiconductor device according to the present invention can prevent the large lowering of a withstand voltage in the peripheral region even when irregularities occur in the number of carriers (dose amount) in the floating region".

(1) Comparison Example and Present Invention Example

A semiconductor device according to the comparison example is a semiconductor device which has substantially the same configuration as the semiconductor device 100 according to the embodiment 1 with respect to points other than a point that floating regions 116 are disposed adjacently to peripheral trenches 160 and a point that in-trench electrodes disposed in first to fourth peripheral trenches counted from an active region A1 side are connected to a source electrode.

A semiconductor device according to the present invention example is a semiconductor device having substantially the same configuration as the semiconductor device 100 according to the embodiment 1 with respect to points other than a point that in-trench electrodes disposed in first to fourth peripheral trenches counted from an active region A1 side are connected to a source electrode.

(2) Simulation Method

With respect to the comparison example and the present invention example, equipotential distribution when a dose amount in floating regions is changed and a withstand voltage BVdss at such a point of time are measured, and evaluation is made based on the measured result.

Figure 6:
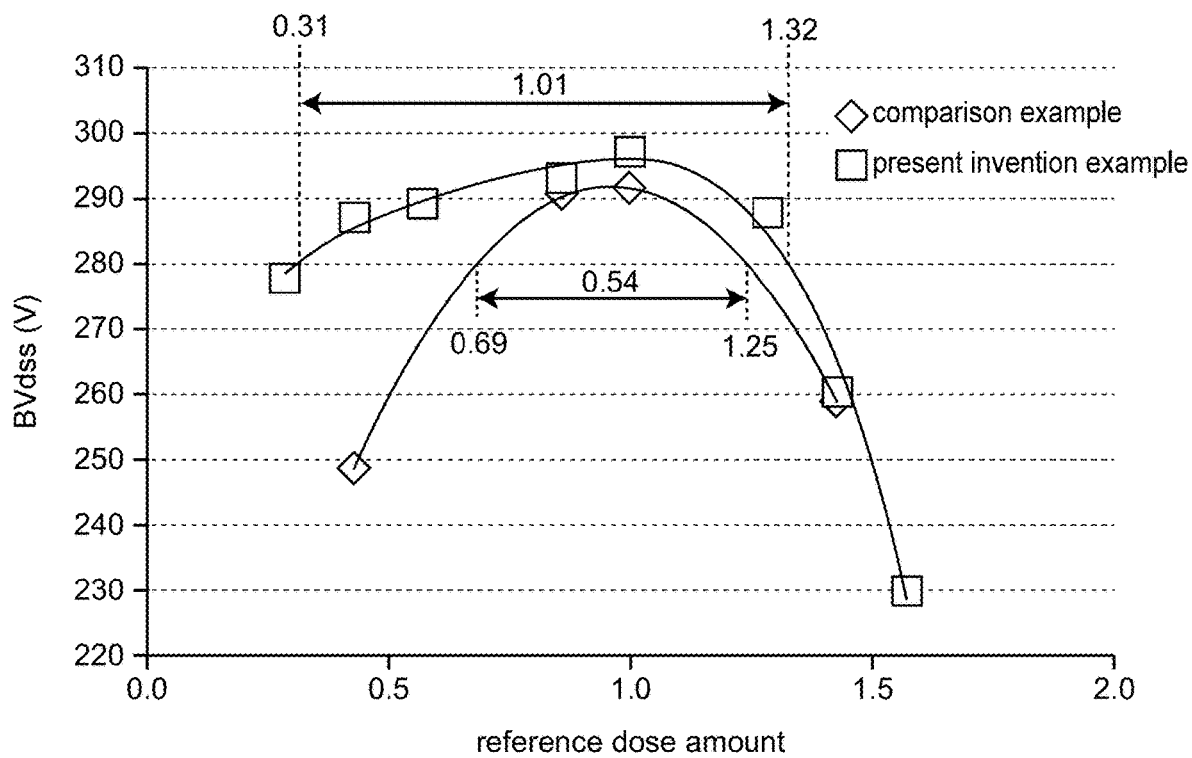
FIG. 6 is a graph showing a relationship between a standard mount of dose and a withstand voltage BVdss in a floating region.
Figure 7:
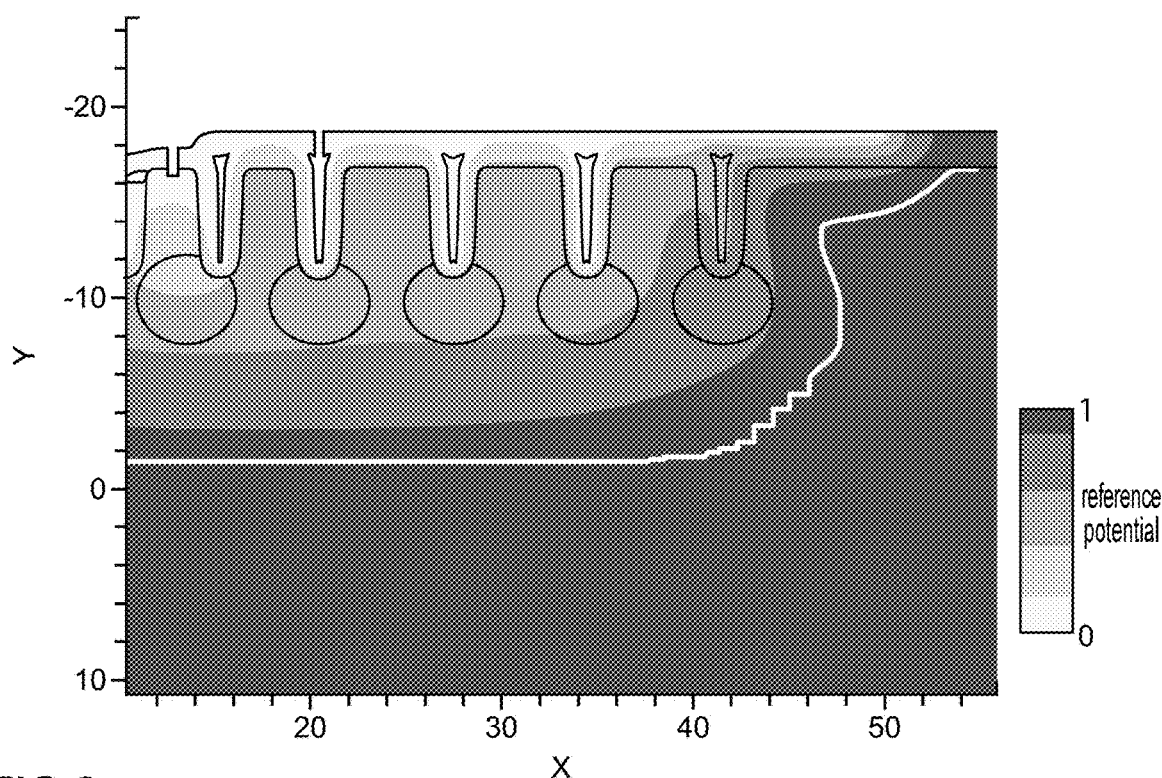
FIG. 7 is a view showing a result of simulation of electric potential distribution at the time of applying a reverse bias in a state where a reference dose amount in a comparative example is set to 1.0.

(3) Result of Evaluation (3-1) Semiconductor Device According to Comparison Example As shown in FIG. 6, in a case where a reference dose amount in the semiconductor device according to the comparison example is 1.0, a withstand voltage is approximately 290 V and hence, the withstand voltage is at a sufficiently practical level. Further, as shown in FIG. 7, a portion where a potential is low spreads to a peripheral trench disposed on an outermost periphery of a peripheral region A2.

However, in the case where a reference dose amount in the semiconductor device according to a comparison example is 0.43, as shown in FIG. 6, a withstand voltage is approximately 250 V. Accordingly, the withstand voltage is largely lowered compared to the case where the reference dose amount is 1.0 (the withstand voltage being approximately 5/6 of the withstand voltage). Further, in the semiconductor device according to the comparison example, to measure a dose margin when a withstand voltage becomes 280 V or more, the withstand voltage becomes 280 V or more when the reference dose amount falls within a range of from 0.69 to 1.23. Accordingly, such a dose margin is 0.54.

Figure 9:
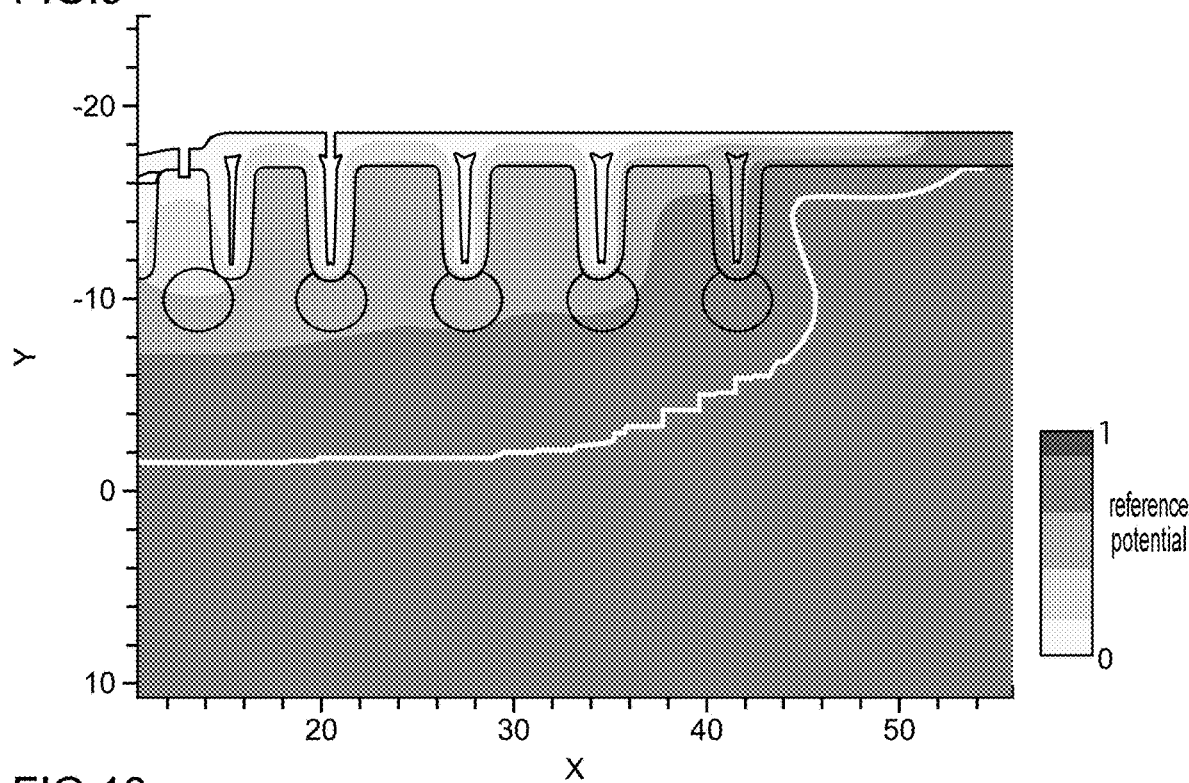
FIG. 9 is a view showing a result of simulation of electric potential distribution at the time of applying a reverse bias in a state where a reference dose amount in the comparative example is set to 0.43.

Further, as shown in FIG. 9, a portion where a potential is low remains in a peripheral trench in front of an outermost periphery of the peripheral region A2, and a width of a depletion layer is narrower than the width of depletion layer when a reference dose amount is 1.0 (particularly on the outermost periphery).

(3-2) Semiconductor Device According to the Present Invention Example

Figure 8:
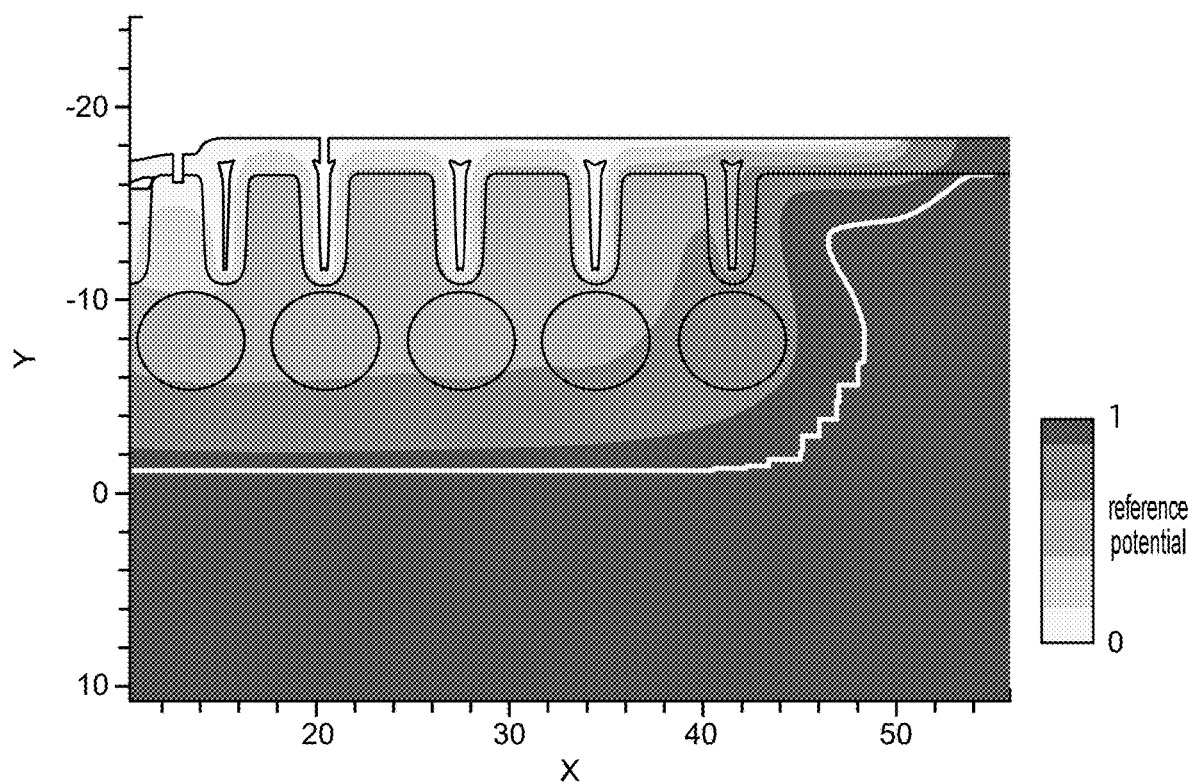
FIG. 8 is a view showing a result of simulation of electric potential distribution at the time of applying a reverse bias in a state where a reference dose amount in a present invention example is set to 1.0.

As shown in FIG. 6, in the case where a reference dose amount in the semiconductor device according to the present invention example is 1.0, a withstand voltage is approximately 295 V and hence, the withstand voltage is at a sufficiently practical level. Further, as shown in FIG. 8, in the same manner as the case of the semiconductor device according to the comparison example, a portion where a potential is low spreads to a peripheral trench disposed on an outermost periphery of a peripheral region A2. Further, a depletion layer spreads also between a floating region deeper than the peripheral trench and a bottom portion of the peripheral trench and hence, the depletion layer maintains a large thickness.

Further, in the case where a reference dose amount in the semiconductor device according to the present invention example is 0.43, as shown in FIG. 6, a withstand voltage is approximately 285 V, and hence, the withstand voltage is not largely lowered compared to the case where the reference dose amount is 1.0.

Further, the semiconductor device according to the present invention example, to measure a dose margin when a withstand voltage becomes 280 V or more, the withstand voltage becomes 280 V or more when the reference dose amount falls within a range of from 0.31 to 1.32. Accordingly, such a dose margin is 1.01. In this manner, a dose margin in the semiconductor device according to the present invention example is approximately twice as large as the dose margin in the semiconductor device according to the comparison example. It is considered that such a result is obtained due to a fact that floating regions are spaced apart from the peripheral trenches and hence, a depletion layer extends also between the peripheral trenches and the floating regions whereby a width of the depletion layer is increased.

Figure 10:
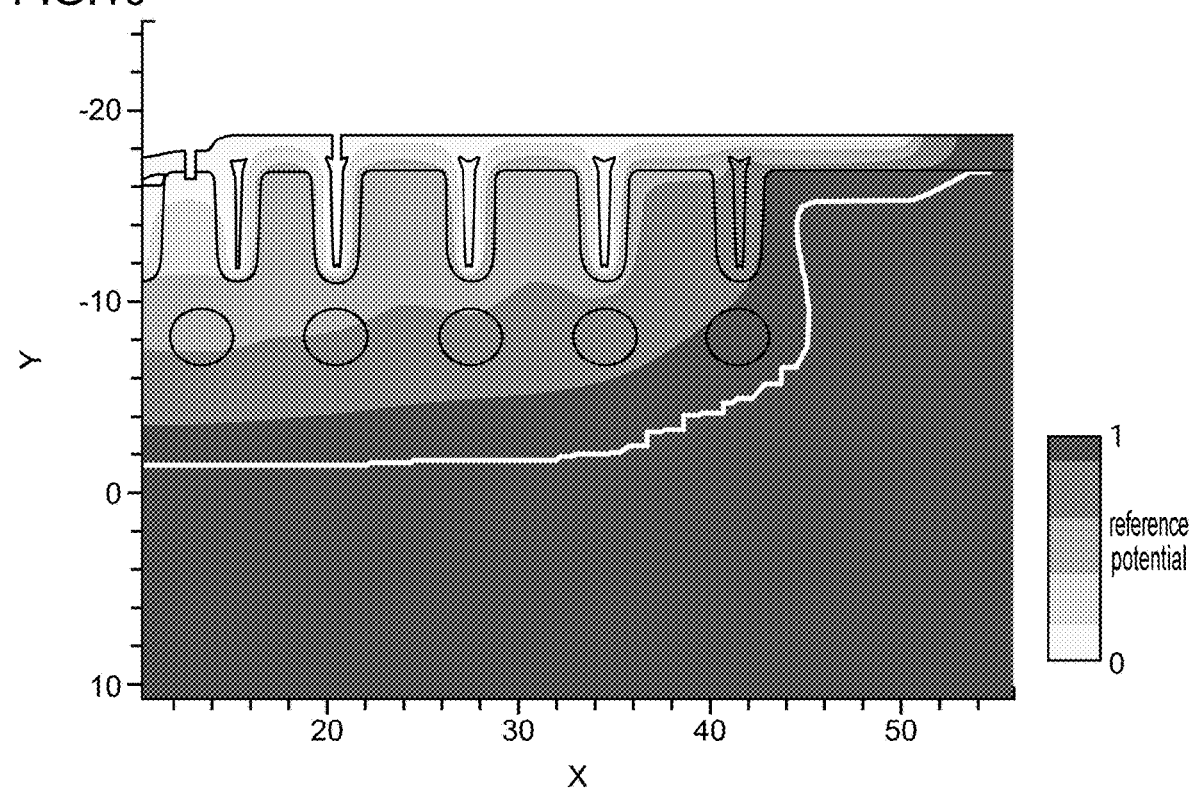
FIG. 10 is a view showing a result of simulation of electric potential distribution at the time of applying a reverse bias in a state where a reference dose amount in the present invention example is set to 0.43.

Further, as shown in FIG. 10, although a portion where a potential is low remains in the peripheral trench just in front of an outermost periphery of the peripheral region A2, the depletion layer extends also between the floating region deeper than the peripheral trench and a bottom portion of the peripheral trench and hence, the depletion layer maintains a large thickness.

From the above, it is found that, in the semiconductor device according to the present invention, the floating regions are disposed at the position away from the peripheral trenches and hence, even when irregularities occur in a dose amount in the floating regions, it is possible to prevent a withstand voltage in the peripheral region from being largely lowered.

4. Advantageous Effects Acquired by Semiconductor Device 100 and Method of Manufacturing Semiconductor Device According to Embodiment 1

According to the semiconductor device 100 of the embodiment 1, the semiconductor base substrate 110 includes, in the peripheral region A2, the p-type floating regions 116 which are disposed in the drift layer 112 at a depth position deeper than the bottom portions of the peripheral trenches 160 in a spaced-apart manner from the peripheral trenches 160 and have a potential in a floating state. With such a configuration, a depletion layer extends in both directions, that is, in a depth direction from the floating regions 116 to the peripheral trenches 160 and in a depth direction away from the peripheral trenches 160. Accordingly, the depletion layer is formed with a large thickness compared to other conventional semiconductor device 900 and hence, an electric field reduction effect at the bottom portions of the peripheral trenches 160 can be increased. As a result, a withstand voltage in the peripheral region can be further increased.

Further, according to the semiconductor device 100 of the embodiment 1, the semiconductor base substrate 110 includes, in the peripheral region A2, the p-type floating regions 116 which are disposed in the drift layer 112 at a depth position deeper than the bottom portions of the peripheral trenches 160 in a spaced-apart manner from the peripheral trenches 160 and have a potential in a floating state. Accordingly, the floating regions 116 can be arranged without receiving a restriction on the arrangement position of the peripheral trenches 160. Accordingly, it is possible to provide a semiconductor device which has a high degree of freedom in designing, and can easily cope with a change in designing.

Further, according to the semiconductor device 100 of the embodiment 1, the semiconductor base substrate 110 includes, in the peripheral region A2, the p-type floating regions 116 which are disposed in the drift layer 112 at a depth position deeper than the bottom portions of the peripheral trenches 160 in a spaced-apart manner from the peripheral trenches 160 and have a potential in a floating state. Accordingly, it is possible to acquire the following advantageous effects (1) to (3). (1) Unlike the case where a process is performed where ion implantation is applied to the bottom portions of the peripheral trenches, there is no possibility that irregularities occur in the number of carriers (dose amount) in the floating regions depending on an angle of ion implantation applied to the bottom portions of the peripheral trenches. (2) Further, even when irregularities occur in the number of carriers (dose amount) in the floating regions 116 due to other factors, it is possible to prevent a withstand voltage in the peripheral region A2 from being largely lowered. (3) Still further, a large dose margin can be obtained (see FIG. 6 to FIG. 10).

Further, in the embodiment 1, in the peripheral region A2, the semiconductor device 100 includes: the plurality of peripheral trenches 160 disposed on the surface of the drift layer 112 and having the bottom portions covered by the drift layer; and the in-trench electrodes 164 formed in the plurality of respective peripheral trenches 160 byway of the insulation layers 162 formed on respective inner surfaces of the peripheral trenches 160.

With such a configuration, a dielectric constant of the oxide film is considerably small compared to a dielectric constant of silicon and hence, even when a large voltage is applied to the oxide film, the oxide film is minimally broken down. Accordingly, a withstand voltage in the peripheral region A2 can be increased compared to a semiconductor device which has none of the peripheral trenches 160, the insulation layers 162, and the in-trench electrodes 164.

The semiconductor device according to the embodiment 1 includes the p-type floating regions 116 having the above-mentioned configuration, and extends a depletion layer to an outer region of the peripheral region A2 at the time of applying a reverse bias. Accordingly, an electric field can be shared not only by the peripheral trenches 160 and the like in the vicinity of the active region A1 but also by the peripheral trenches (oxide films) in the vicinity of the outer periphery. As a result, according to the semiconductor device of the present invention, it is possible to maintain an even higher withstand voltage.

The semiconductor device 100 according to the embodiment 1 has the plurality of floating regions disposed in a spaced-apart manner from each other as the floating regions 116. Accordingly, it is possible to make the depletion layer extending from the active region A1 easily spread toward the outer periphery of the peripheral region A2. As a result, a withstand voltage in the peripheral region A2 is further minimally lowered.

The semiconductor device 100 according to the embodiment 1 has a boundary floating region 117 which is disposed in the drift layer 112 at the position deeper than the bottom portion of the trench 150 in a spaced-apart manner from the trenches 150, and has a potential in a floating state. The boundary floating region 117 is, as viewed in a plan view, disposed between the trench closest to the peripheral region A2 among the plurality of trenches 150 in the active region A1 and the peripheral trench 160 closest to the active region A1 among the plurality of peripheral trenches 160 in the peripheral region A2. With such a configuration, it is possible to easily extend the depletion layer in the active region A1 to the peripheral region A2.

In the semiconductor device 100 according to the embodiment 1, in the peripheral region A2, the distance between the peripheral trenches 160 disposed adjacently to each other on the active region A1 side differs from the distance between the peripheral trenches 160 disposed adjacently to each other on an outer peripheral side. Accordingly, it is possible to arrange the peripheral trenches 160 at positions corresponding to the extending of the depletion layer and hence, a withstand voltage in the peripheral region A2 can be further increased.

In the semiconductor device 100 according to the embodiment 1, in the peripheral region A2, the distance between the peripheral trenches 160 disposed adjacently to each other on the active region A1 side is narrower than the distance between the peripheral trenches 160 disposed adjacently to each other on the outer peripheral side. Accordingly, it is possible to make depletion layer easily extend to the peripheral region A2.

In the semiconductor device 100 according to the embodiment 1, the floating regions 116 are formed at dopant concentration with which the floating regions 116 are completely depleted at the time of applying a reverse bias. Accordingly, the inside of the floating regions 116 can be also depleted and hence, a peripheral withstand voltage is minimally lowered.

In the semiconductor device 100 according to the embodiment 1, the in-trench electrode 164 disposed in the first peripheral trench 160 on the active region A1 side among the plurality of peripheral trenches 160 is connected with the source electrode 130. Accordingly, between the trench disposed closest to the peripheral region A2 among the plurality of trenches 150 in the active region A1 and the peripheral trench disposed closest to the active region A1 among the plurality of peripheral trenches 160 in the peripheral region A2, the depletion layer extends from the p-type base region 113, the trench 150 disposed closest to the peripheral region A2 (the shield electrode 158 having a source potential), and the peripheral trench 160 disposed closest to the active region A1 which are connected with the source electrode 130 via the metal plugs 134 and the p-type contact regions 118 respectively and hence, it is possible to easily extend the depletion layer by making use of a pinch-off effect. Accordingly, a withstand voltage in this region can be increased.

Assume the case where the in-trench electrode 164 in the first peripheral trench 160 from the active region A1 side is brought into contact with the source electrode 130, and a potential of the in-trench electrode 164 in the second peripheral trench 160 is in a floating state. In this case, the in-trench electrode 164 in the second peripheral trench 160 does not have a potential and hence, equipotential lines extend in a surface direction in a curved shape between the first peripheral trench 160 and the second peripheral trench counted from the active region A1 side whereby the number of equipotential lines which enter between the first peripheral trench 160 and the second peripheral trench 160 is inevitably increased. Accordingly, in a portion in the vicinity of the bottom portion of the first peripheral trench 160 counted from the active region A1 side which is a portion where a potential is likely to increase, the equipotential lines are disposed densely and hence, an electric field concentration is likely to occur. Accordingly, an avalanche breakdown is likely to occur at the bottom portion of the peripheral trench 160. As a result, a peripheral withstand voltage cannot be increased and hence, it is difficult to prevent the occurrence of a breakdown in the peripheral region A2.

To the contrary, in the semiconductor device 100 according to the embodiment 1, among the plurality of peripheral trenches 160, the in-trench electrode 164 disposed in the second peripheral trench 160 counted from the active region A1 side is connected with the source electrode 130 and hence, equipotential lines extend in a surface direction in a curved shape between the second peripheral trench 160 and the third peripheral trench 160 counted from the active region A1 side whereby the number of equipotential lines which enter between the second peripheral trench 160 and the third peripheral trench 160 is increased. Accordingly, although the equipotential lines disposed in the vicinity of the bottom portion of the second peripheral trench 160 counted from the active region A1 side becomes dense, there is no contact and hence, a leak current is small whereby an avalanche breakdown minimally occurs. On the other hand, at the bottom portion of the first peripheral trench 160 counted from the active region A1 side which is a portion where a potential is likely to increase, the equipotential lines minimally become dense and hence, a leak current in such a portion is suppressed whereby an avalanche breakdown minimally occurs. As a result, a peripheral withstand voltage can be increased and hence, the occurrence of breakdown in the peripheral region A2 can be prevented.

Accordingly, in the semiconductor device 100 according to the embodiment 1, the in-trench electrodes 164 disposed in two peripheral trenches on the active region A1 side among the plurality of peripheral trenches 160 are connected with the source electrode 130 and hence, a peripheral withstand voltage can be increased whereby the occurrence of breakdown in the peripheral region A2 can be prevented.

In the semiconductor device 100 according to the embodiment 1, the in-trench electrodes 164 disposed in the peripheral trenches 160 other than two peripheral trenches 160 on the active region A1 side among the plurality of peripheral trenches 160 have a potential in a floating state. Accordingly, in a step where the depletion layer extends from the active region A1 to the peripheral region A2 at the time of applying a reverse bias, potentials of the in-trench electrodes 164 are sequentially determined and hence, a voltage can be shared by the insulation layers 162 of the peripheral trenches 160.

A method of manufacturing the semiconductor device according to the embodiment 1 includes: the first semiconductor layer forming step; the second conductive type dopant introducing step of introducing a second conductive type dopant into the first semiconductor layer; the second semiconductor layer forming step; a peripheral trench forming step; and a main electrode forming step. The method of manufacturing the semiconductor device according to the embodiment 1 further includes the floating region forming step of forming the floating regions using the second conductive type dopant between the second conductive type dopant introducing step and the main electrode forming step. Accordingly, to compare with a process where ion implantation is applied to the bottom portions of the peripheral trenches 160, even when irregularities occur in an angle of introducing ions, there is no possibility that dopant concentration and a size of the floating region 116 deviate from values at the time of designing. There is also no possibility that coarseness and denseness occur in dopant concentration in the floating regions 116. Further, irregularities in the number of carriers (dose amount) in the floating regions 116 minimally occur. As a result, it is possible to manufacture a semiconductor device where a withstand voltage in the peripheral region A2 is minimally lowered.

In the method of manufacturing the semiconductor device according to the embodiment 1, the first semiconductor layer forming step, the second conductive type dopant introducing step of introducing a second conductive type dopant into the first semiconductor layer or onto a surface of the first semiconductor layer, the second semiconductor layer forming step, and the peripheral trench forming step are performed in this order. Accordingly, the floating regions 116 can be arranged without receiving a restriction with respect to the arrangement positions of the peripheral trenches 160. Accordingly, it is possible to manufacture a semiconductor device which has a high degree of freedom in designing, and can easily cope with a change in designing.

The method of manufacturing the semiconductor device according to the embodiment 1 includes the peripheral trench forming step of forming the peripheral trenches 160 at a position shallower than a depth position at which the second conductive type dopant is introduced in a predetermined region of a surface of the second semiconductor layer 112b in a region which is defined as the peripheral region A2 after manufacturing of the semiconductor device. Accordingly, in the manufactured semiconductor device 100, the depletion layer extends in both directions, that is, in a depth direction from the floating regions 116 to the peripheral trenches 160 and in a depth direction away from the peripheral trenches 160. Accordingly, compared to the conventional semiconductor device, the depletion layer can be formed with a large thickness and hence, an electric field reduction effect at the bottom portions of the peripheral trenches 160 can be increased. As a result, a withstand voltage in the peripheral region A2 is minimally lowered.

The method of manufacturing the semiconductor device according to the embodiment 1 further includes: the second conductive type dopant introducing step of introducing a p-type dopant in the first semiconductor layer 112a or onto the surface of the first semiconductor layer 112a in a predetermined region of a region defined as the peripheral region A2 disposed outside the active region A1 formed after manufacturing of the semiconductor device; the second semiconductor layer forming step of forming the n-type second semiconductor layer 112b having a predetermined thickness by an epitaxial growth method on the first semiconductor layer 112a into which the p-type dopant is introduced; the peripheral trench forming step of forming the peripheral trenches 160 disposed shallower than a depth position at which the p-type dopant is introduced in a predetermined region of a surface of the second semiconductor layer 112b in a region which is defined as the peripheral region A2 after manufacturing of the semiconductor device; the in-trench electrode forming step of forming the insulation layer 162 on the inner surfaces of the peripheral trenches 160 respectively and forming the in-trench electrodes 164 in the peripheral trenches 160 by way of the insulation layers 162; and the main electrode forming step which includes a step of forming the source electrode 130 on the surface of the second semiconductor layer 112b and a step of forming the drain electrode 140 on the surface of the first semiconductor layer 112a, wherein the method of manufacturing the semiconductor device further includes the floating region forming step of forming the floating regions 116 using the p-type dopant between the second conductive type dopant introducing step and the main electrode forming step. Accordingly, it is possible to acquire the following advantageous effects (1) to (3). (1) Unlike the case where a process is performed where ion implantation is applied to the bottom portions of the peripheral trenches 160, there is no possibility that irregularities occur in the number of carriers (dose amount) in the floating region 116 depending on an angle of ion implantation applied to the bottom portion of the peripheral trenches. (2) Further, even when irregularities occur in the number of carriers (dose amount) in the floating region 116 due to other factors, it is possible to prevent a withstand voltage in the peripheral region A2 from being largely lowered. (3) Still further, a large dose margin can be obtained (see FIG. 6 to FIG. 10).

Modification 1

Figure 11A:
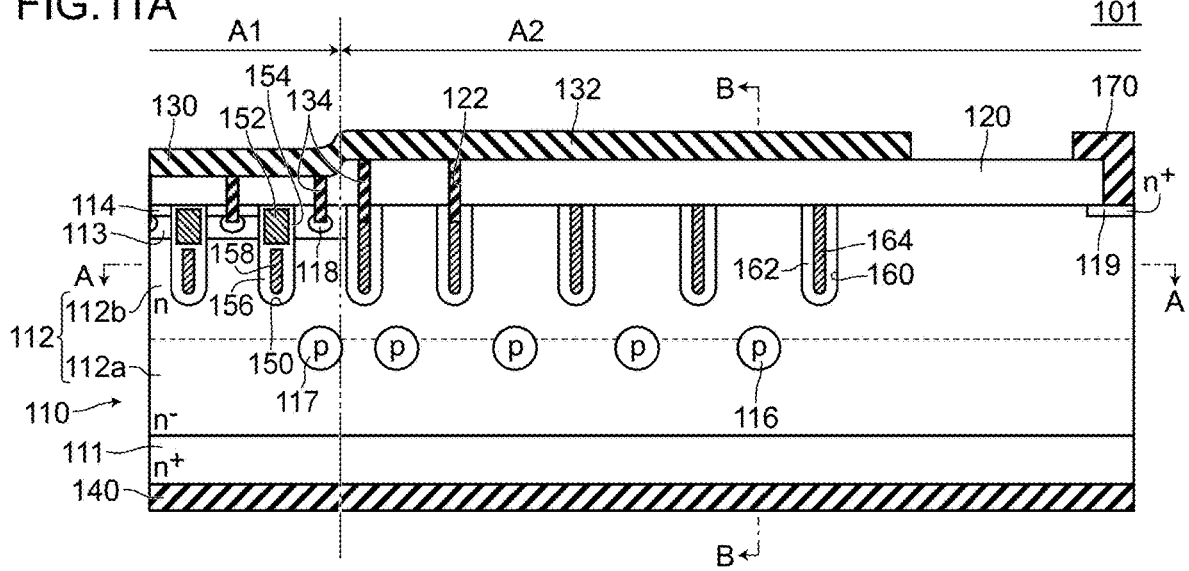
FIG. 11A to FIG. 11C are views showing a semiconductor device 101 according to a modification 1.
Figure 11B:
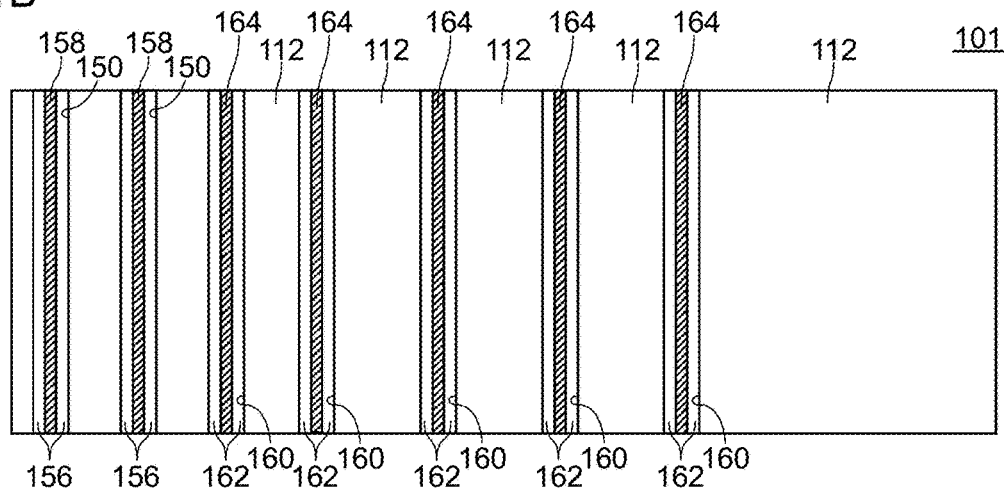
Figure 11C:
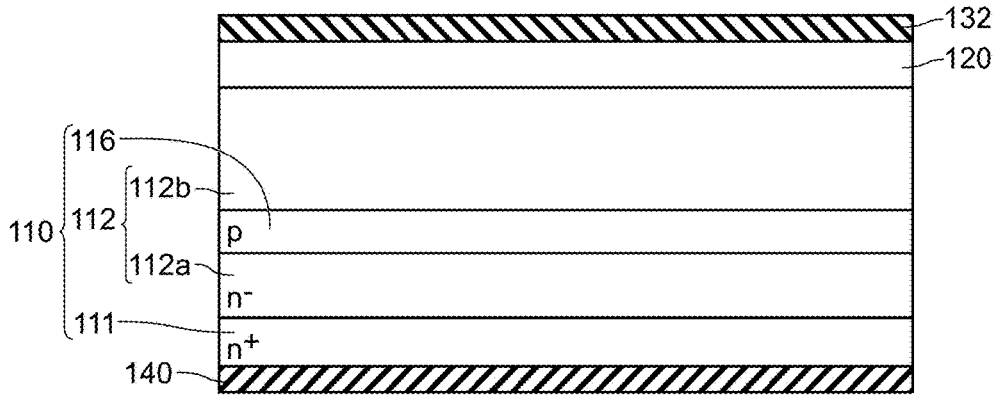

A semiconductor device 101 according to a modification 1 basically has substantially the same configuration as the semiconductor device 100 according to the embodiment 1. However, the semiconductor device 101 according to the modification 1 differs from the semiconductor device 100 according to the embodiment 1 with respect to the configuration of floating regions. That is, in the semiconductor device 101 according to the modification 1, as shown in FIG. 11A to FIG. 11C, each floating region 116 is disposed between peripheral trenches 160 disposed adjacently to each other.

In the same manner as the semiconductor device 100 according to the embodiment 1, in the semiconductor device 101 according to the modification 1, a semiconductor base substrate 110 includes, in a peripheral region A2, a plurality of p-type floating regions 116 which are disposed in a drift layer 112 at a depth position deeper than bottom portions of the peripheral trenches 160 in a spaced-apart manner from peripheral trenches 160 and have a potential in a floating state. With such a configuration, the depletion layer extends in both directions, that is, in a depth direction from the floating regions 116 to the peripheral trenches 160 and in a depth direction away from the peripheral trenches 160. Accordingly, the depletion layer is formed with a large thickness compared to the other conventional semiconductor device 900 and hence, an electric field reduction effect at the bottom portions of the peripheral trenches 160 can be increased. As a result, a withstand voltage in the peripheral region can be further increased.

Modification 2

Figure 12A:
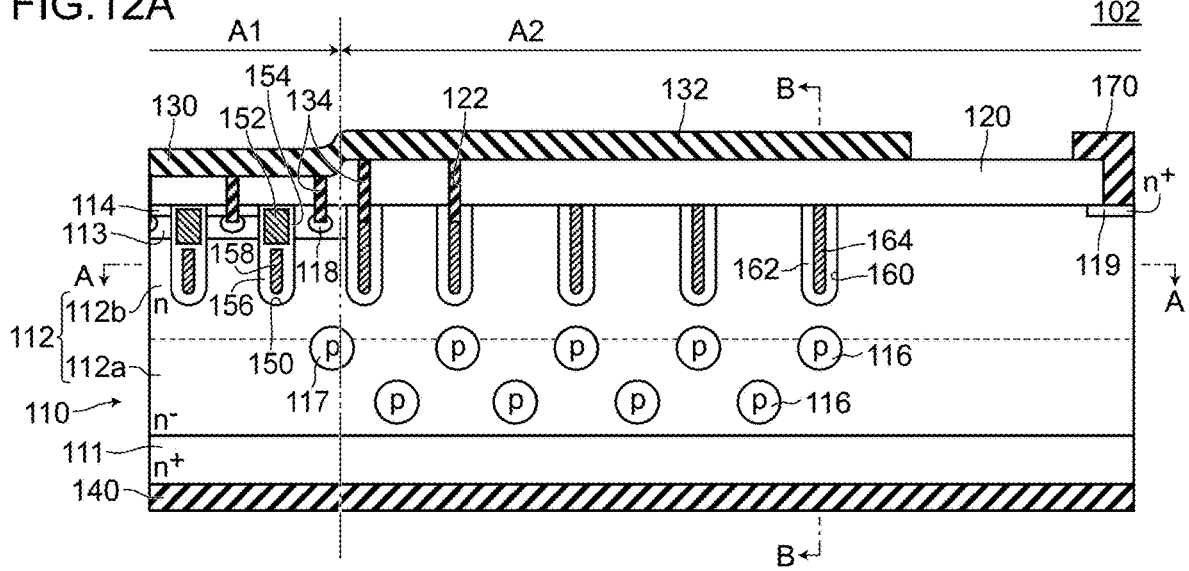
FIG. 12A to FIG. 12C are views showing a semiconductor device 102 according to a modification 2.
Figure 12B:
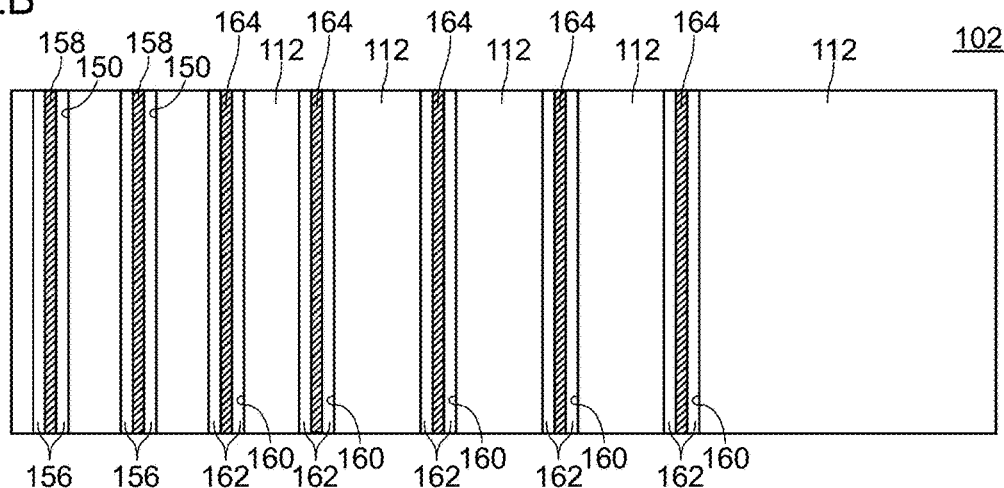
Figure 12C:
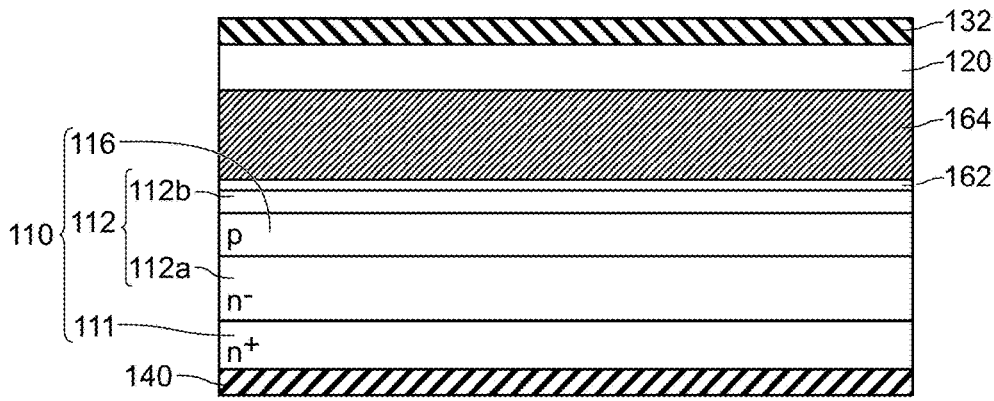

A semiconductor device 102 according to a modification 2 basically has substantially the same configuration as the semiconductor device 100 according to the embodiment 1. However, the semiconductor device 102 according to the modification 2 differs from the semiconductor device 100 according to the embodiment 1 with respect to the configuration of floating regions. That is, in the semiconductor device 102 according to the modification 2, as shown in FIG. 12A to FIG. 12C, floating regions 116 are disposed at intermediate positions each of which is disposed between peripheral trenches 160 and just below the peripheral trenches 160.

In the semiconductor device 102 according to the modification 2, the floating regions 116 are disposed in a staggered manner such that the floating regions 116 disposed at the intermediate positions each of which is disposed between the peripheral trenches 160 are disposed on a lower stage and the floating regions disposed just below the peripheral trenches 160 are disposed on an upper stage. With such a configuration, a drift layer 112 can be efficiently depleted.

In the same manner as the case of the semiconductor device 100 according to the embodiment 1, in the semiconductor device 102 according to the modification 2, a semiconductor base substrate 110 includes, in a peripheral region A2, a plurality of the p-type floating regions 116 which are disposed in the drift layer 112 at a depth position deeper than bottom portions of the peripheral trenches 160 in a spaced-apart manner from the peripheral trenches 160 and have a potential in a floating state. With such a configuration, the depletion layer extends in both directions, that is, in a depth direction from the floating regions 116 to the peripheral trenches 160 and in a depth direction away from the peripheral trenches 160. Accordingly, the depletion layer is formed with a large thickness compared to the other conventional semiconductor device 900 and hence, an electric field reduction effect at the bottom portions of the peripheral trenches 160 can be increased. As a result, a withstand voltage in the peripheral region A2 can be further increased.

Modification 3

Figure 13A:
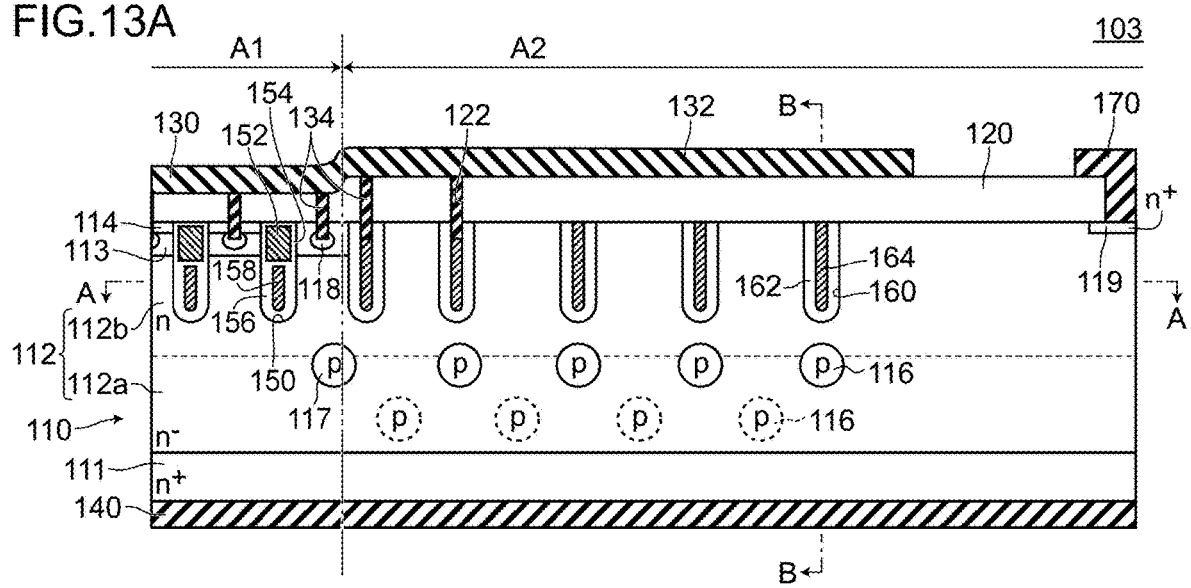
FIG. 13A to FIG. 13C are views showing a semiconductor device 103 according to a modification 3.
Figure 13B:
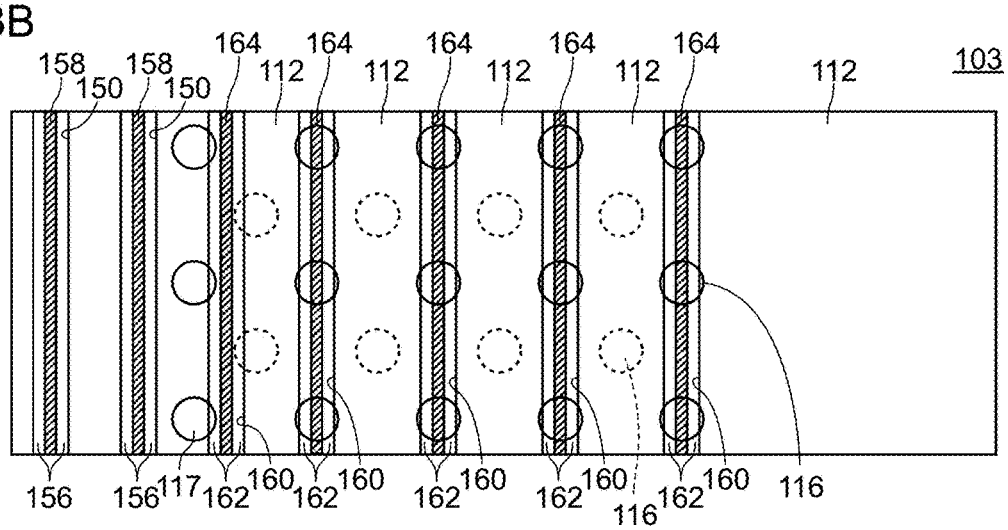
Figure 13C:
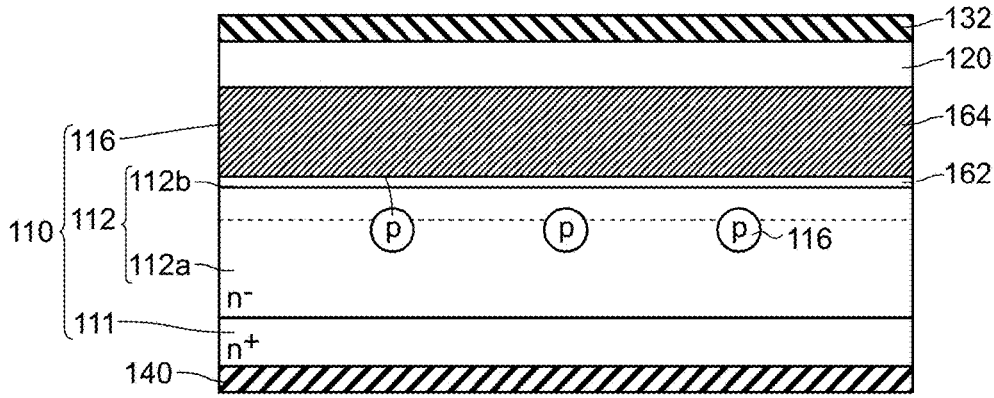

A semiconductor device 103 according to a modification 3 basically has substantially the same configuration as the semiconductor device 100 according to the embodiment 1. However, the semiconductor device 103 according to the modification 3 differs from the semiconductor device 100 according to the embodiment 1 with respect to the configuration of floating regions. That is, in the semiconductor device 103 according to the modification 3, as shown in FIG. 13A to FIG. 13C, floating regions 116 are not formed in a stripe shape but in a shape formed of separate individual islands.

In the semiconductor device 103 according to the modification 3, the floating regions 116 are disposed just below the peripheral trenches at a predetermined interval along peripheral trenches in a stripe shape, and also are disposed at intermediate positions each of which is disposed between the peripheral trenches in a staggered manner as viewed in a depth direction. With such a configuration, a drift layer 112 can be efficiently depleted.

In the same manner as the case of the semiconductor device 100 according to the embodiment 1, in the semiconductor device 103 according to the modification 3, a semiconductor base substrate 110 includes, in a peripheral region A2, a plurality of the p-type floating regions 116 which are disposed in the drift layer 112 at a depth position deeper than bottom portions of the peripheral trenches 160 in a spaced-apart manner from the peripheral trenches 160 and have a potential in a floating state. With such a configuration, the depletion layer extends in both directions, that is, in a depth direction from the floating regions 116 to the peripheral trenches 160 and in a depth direction away from the peripheral trenches 160. Accordingly, the depletion layer is formed with a large thickness compared to the other conventional semiconductor device 900 and hence, an electric field reduction effect at the bottom portions of the peripheral trenches 160 can be increased. As a result, a withstand voltage in the peripheral region A2 can be further increased.

Embodiment 2

Figure 14A:
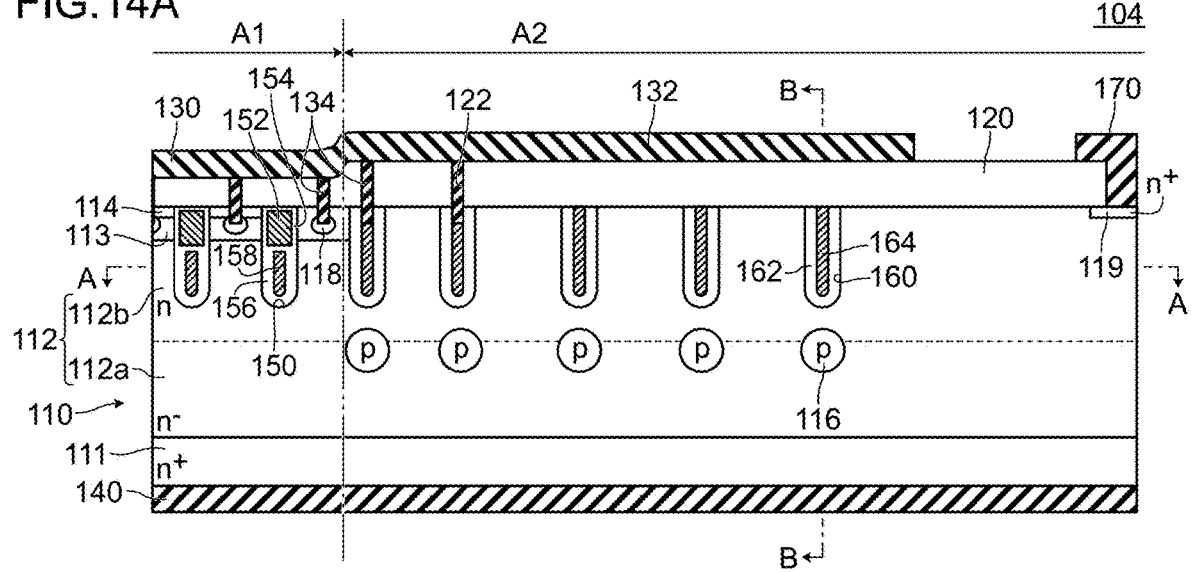
FIG. 14A to FIG. 14C are views showing a semiconductor device 104 according to an embodiment 2.
Figure 14B:
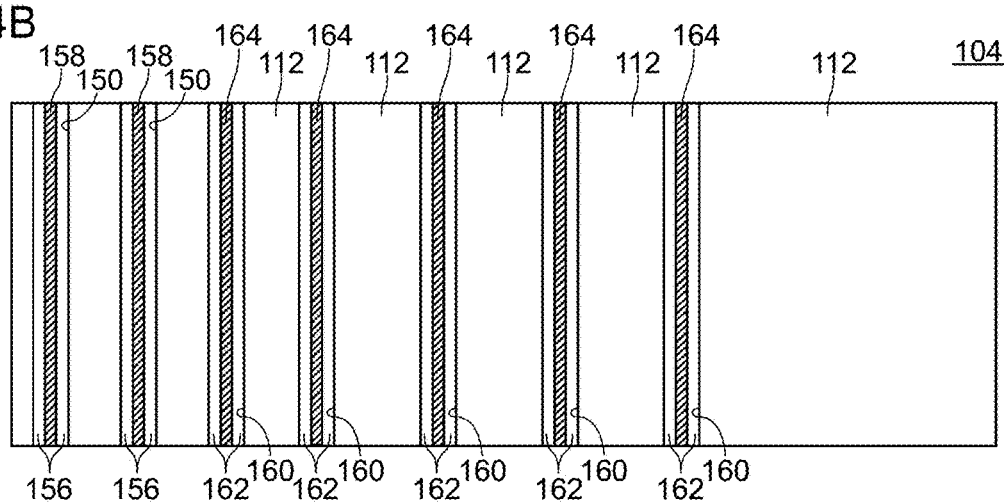
Figure 14C:
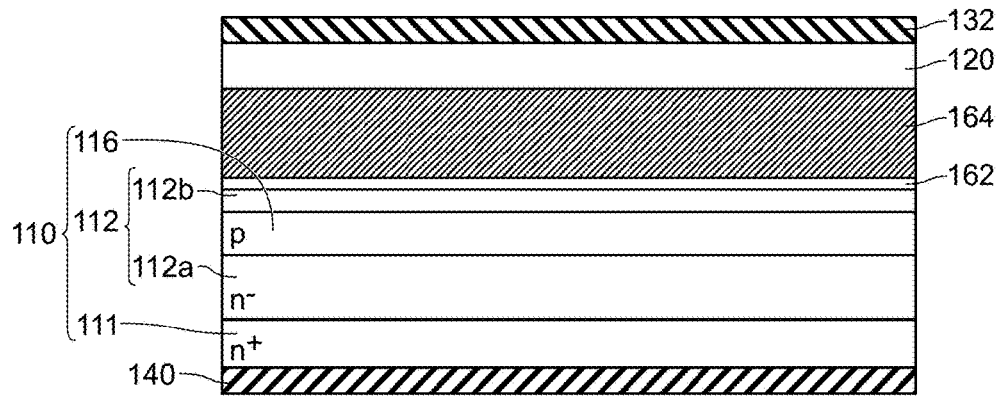

A semiconductor device 104 according to an embodiment 2 basically has substantially the same configuration as the semiconductor device 100 according to the embodiment 1. However, the semiconductor device 104 according to the embodiment 2 differs from the semiconductor device 100 according to the embodiment 1 with respect to a point that a boundary floating region does not exist (see FIG. 14A to FIG. 14C). In the embodiment 2, in place of forming the boundary floating region, a floating region 116 is disposed also just below a peripheral trench 160 closest to an active region A1.

In this manner, the semiconductor device 104 according to the embodiment 2 differs from the case of the method of manufacturing a semiconductor device according to the embodiment 1 with respect to the point that the boundary floating region does not exist. However, in the same manner as the case of the semiconductor device 100 according to the embodiment 1, a semiconductor base substrate 110 includes, in a peripheral region A2, a plurality of p-type floating regions 116 which are disposed in a drift layer 112 at a depth position deeper than bottom portions of the peripheral trenches 160 in a spaced-apart manner from the peripheral trenches 160 and have a potential in a floating state. With such a configuration, depletion layer extends in both directions, that is, in a depth direction from the floating regions 116 to the peripheral trenches 160 and in a depth direction away from the peripheral trenches 160. Accordingly, the depletion layer is formed with a large thickness compared to the other conventional semiconductor device 900 and hence, an electric field reduction effect at the bottom portions of the peripheral trenches 160 can be increased. As a result, a withstand voltage in the peripheral region A2 can be further increased.

The semiconductor device 104 according to the embodiment 2 has substantially the same configuration as the semiconductor device 100 according to the embodiment 1 with respect to points other than a point that the boundary floating region does not exist. Accordingly, the semiconductor device 104 according to the embodiment 2 acquires the corresponding advantageous effects found amongst all advantageous effects which the semiconductor device 100 according to the embodiment 1 acquires.

Embodiment 3

Figure 15A:
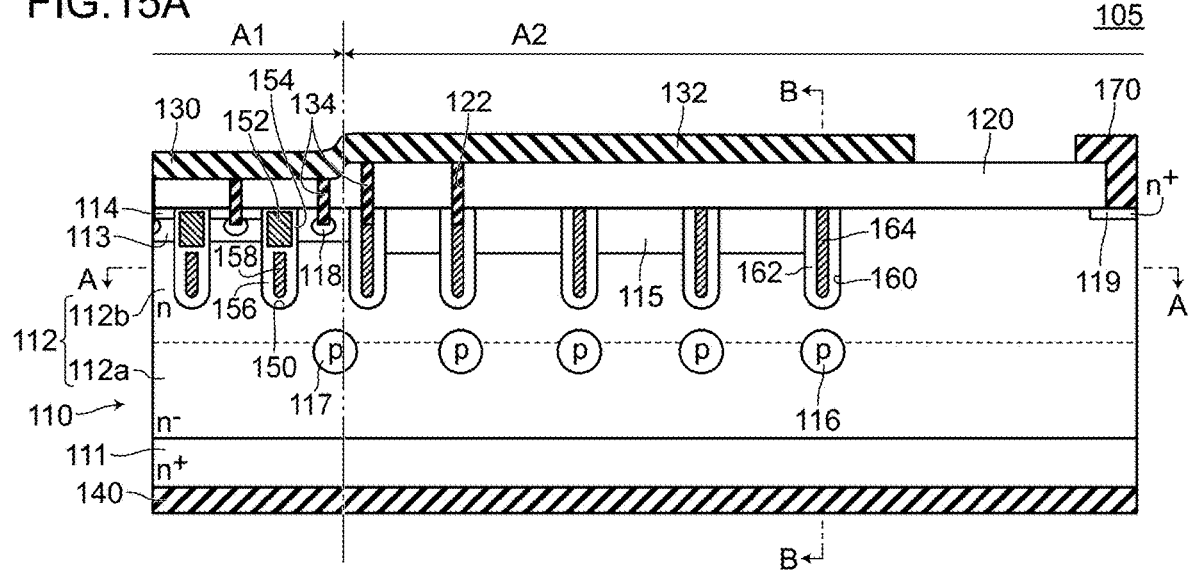
FIG. 15A to FIG. 15C are views showing a semiconductor device 105 according to an embodiment 3.
Figure 15B:
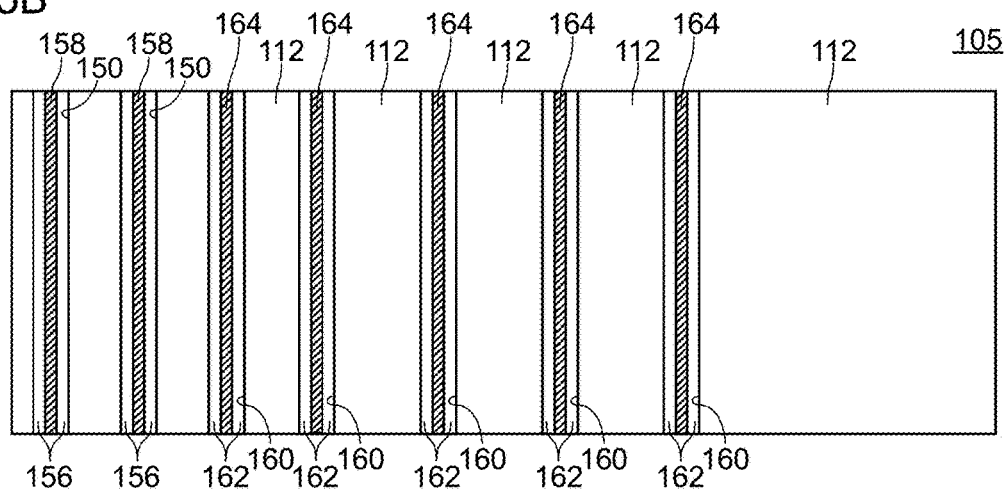
Figure 15C:
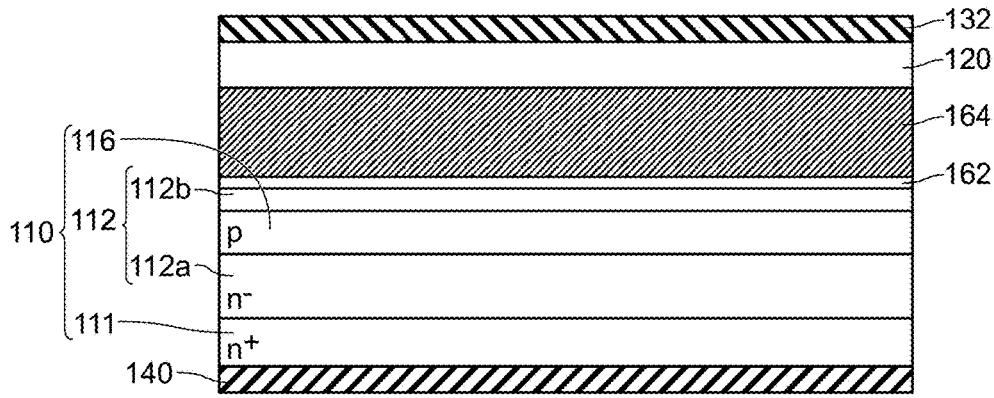

A semiconductor device 105 according to an embodiment 3 basically has substantially the same configuration as the semiconductor device 100 according to the embodiment 1. However, the semiconductor device 105 according to the embodiment 3 differs from the semiconductor device 100 according to the embodiment 1 with respect to a point that a surface semiconductor layer exists (see FIG. 15A to FIG. 15C). That is, a semiconductor base substrate 110 includes, on a surface of a drift layer 112 in a peripheral region A2, p-type surface semiconductor layers 115 each of which is disposed between peripheral trenches 160 disposed adjacently each other and having higher dopant concentration than floating regions 116.

In this manner, the semiconductor device 105 according to the embodiment 3 differs from the case of the method of manufacturing a semiconductor device according to the embodiment 1 with respect to the point that the surface semiconductor layer exists. However, in the same manner as the case of the semiconductor device 100 according to the embodiment 1, a semiconductor base substrate 110 includes, in a peripheral region A2, a plurality of p-type floating regions 116 which are disposed in a drift layer 112 at a depth position deeper than bottom portions of the peripheral trenches 160 in a spaced-apart manner from the peripheral trenches 160 and have a potential in a floating state. With such a configuration, the depletion layer extends in both directions, that is, in a depth direction from the floating regions 116 to the peripheral trenches 160 and in a depth direction away from the peripheral trenches 160. Accordingly, the depletion layer is formed with a large thickness compared to the other conventional semiconductor device 900 and hence, an electric field reduction effect at the bottom portions of the peripheral trenches 160 can be increased. As a result, a withstand voltage in the peripheral region A2 can be further increased.

Further, in the semiconductor device 105 according to the embodiment 3, the semiconductor base substrate 110 includes, on the surface of the drift layer 112 in the peripheral region A2, the p-type surface semiconductor layers 115 disposed between the peripheral trenches 160 disposed adjacently to each other and having higher dopant concentration than the floating regions 116 and hence, the drift layer 112 between the peripheral trenches 160 disposed adjacently to each other can be easily depleted.

The semiconductor device 105 according to the embodiment 3 has substantially the same configuration as the semiconductor device 100 according to the embodiment 1 with respect to points other than a point that the surface semiconductor layers exist. Accordingly, the semiconductor device 105 according to the embodiment 3 acquires the corresponding advantageous effects found amongst all advantageous effects which the semiconductor device 100 according to the embodiment 1 acquires.

Although the present invention has been described based on the above-mentioned embodiments, the present invention is not limited to the above-mentioned embodiments. The present invention can be carried out in various modes without departing from the gist of the present invention, and the following modifications are also conceivable, for example.

(1) In the above-mentioned respective embodiments (also including the respective modifications, the same definition being applicable hereinafter), the materials, the shapes, the positions, the sizes and the like are described for an exemplifying purpose, and these can be changed within a scope that the advantageous effects of the present invention are not impaired.

(2) The floating regions 116 and the boundary floating region 117 may be disposed at suitable positions provided that the floating regions 116 and the boundary floating region 117 are spaced apart from each other.

(3) In the above-mentioned respective embodiments, the floating regions (and the boundary floating region) are formed by an ion implantation method. However, the present invention is not limited to such a configuration. The floating regions (and the boundary floating region) may be formed by an epitaxial growth method. In this case, a technique may be adopted where a first semiconductor layer is formed and, thereafter, p-type semiconductor layers are formed on the first semiconductor layer in a selective epitaxial growth method and, thereafter, a second semiconductor layer is formed by an epitaxial growth method. Further, a technique may be used where a second conductive type dopant is diffused in a first semiconductor layer from a film doped with a second conductive type dopant.

(4) In the above-mentioned respective embodiments, a MOSFET is used as the semiconductor device. However, the present invention is not limited to such a configuration. As the semiconductor device, the present invention is applicable to a suitable semiconductor device such as an IGBT, various diodes, a thyristor, or a triac.

Figure 16A:
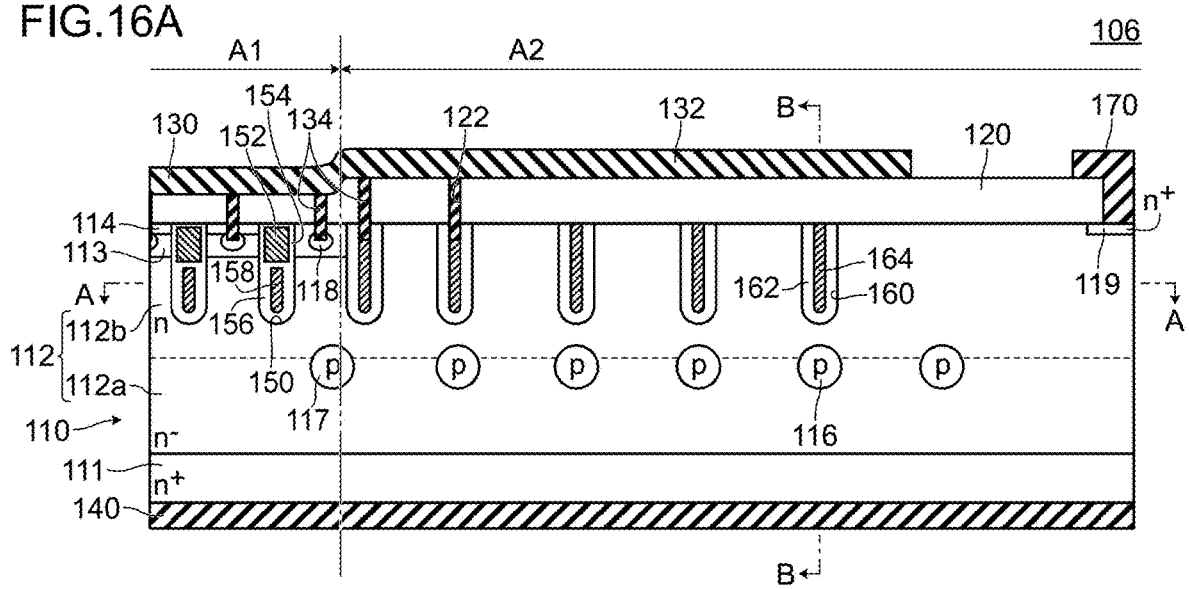
FIG. 16A to FIG. 16C are views showing a semiconductor device 106 according to a modification 4.
Figure 16B:
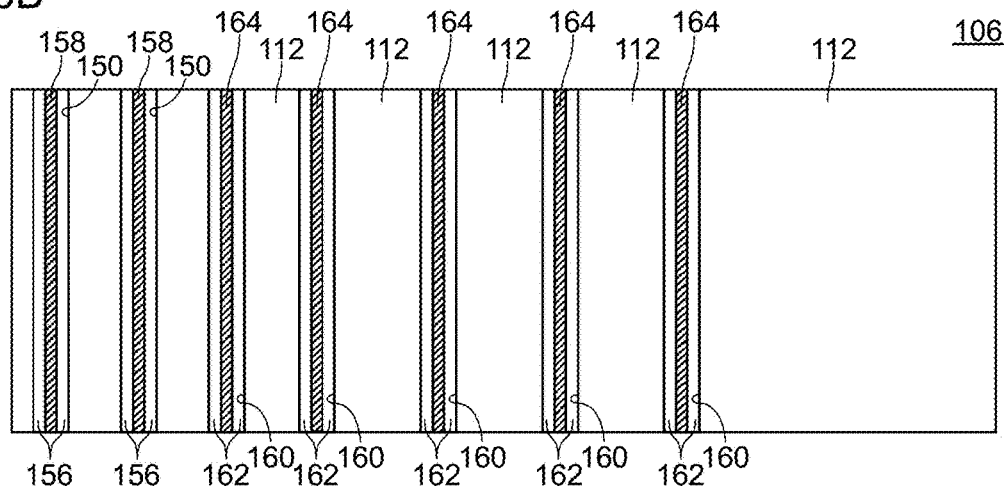
Figure 16C:
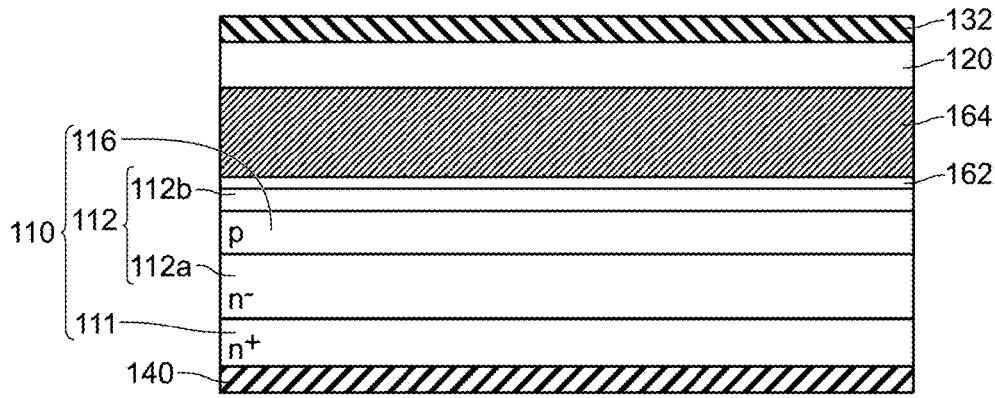

(5) In the above-mentioned respective embodiments, the floating regions 116 are formed only on an inner peripheral side of the peripheral trench 160 on the outermost periphery (the region where the peripheral trenches are disposed). However, the present invention is not limited to such a configuration. The floating regions may be further formed outside the peripheral trench 160 on the outermost periphery (outside the region where the peripheral trenches are disposed) (a semiconductor device 106 according to a modification 4, see FIG. 16A to FIG. 16C). In the semiconductor device 106 according to the modification 4, only one floating region 116 is formed outside the peripheral trench 160 on the outermost periphery. However, a plurality of floating regions 116 may be formed outside the peripheral trench 160 on the outermost periphery.

Figure 17A:
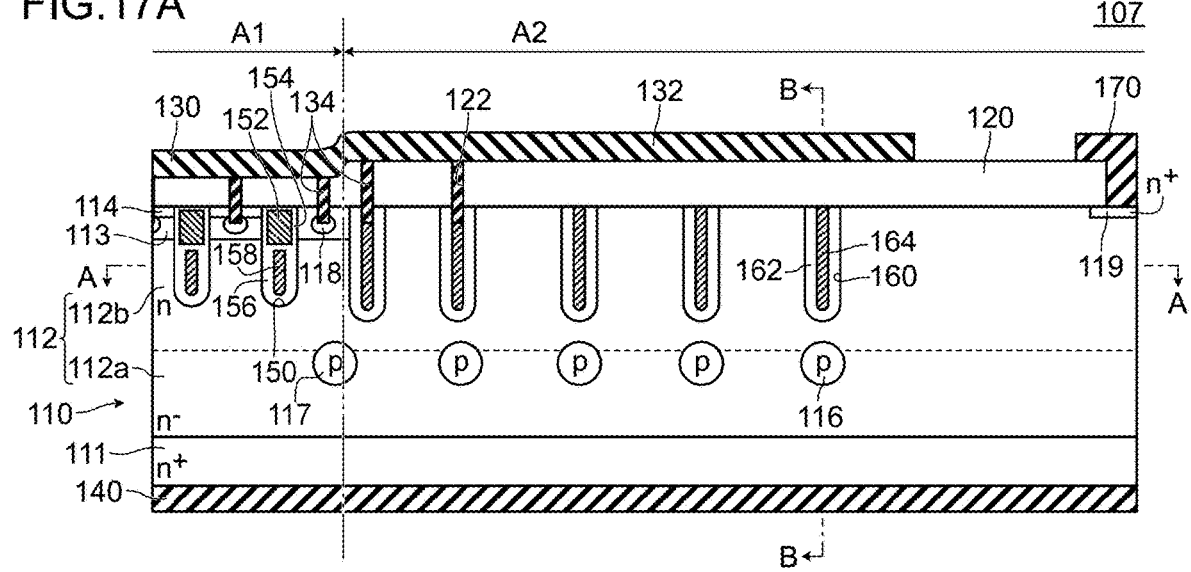
FIG. 17A to FIG. 17C are views showing a semiconductor device 107 according to a modification 5.
Figure 17B:
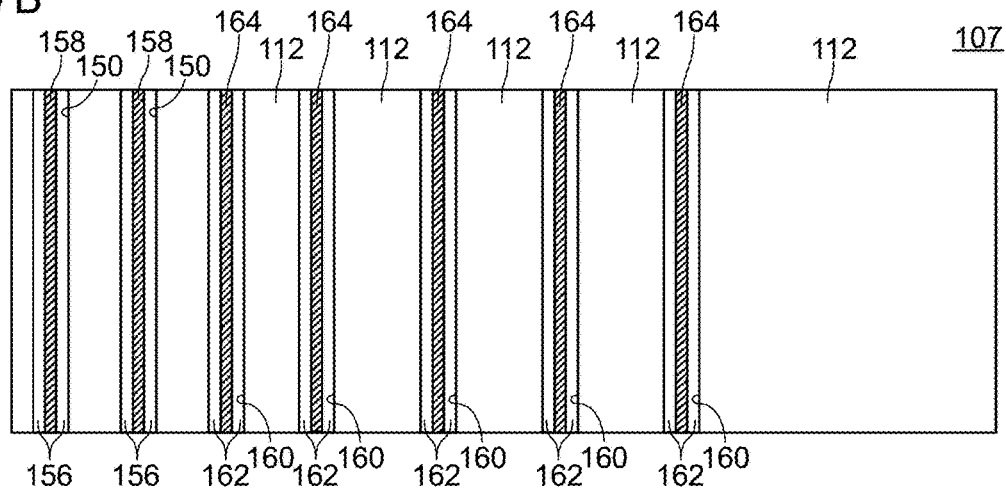
Figure 17C:
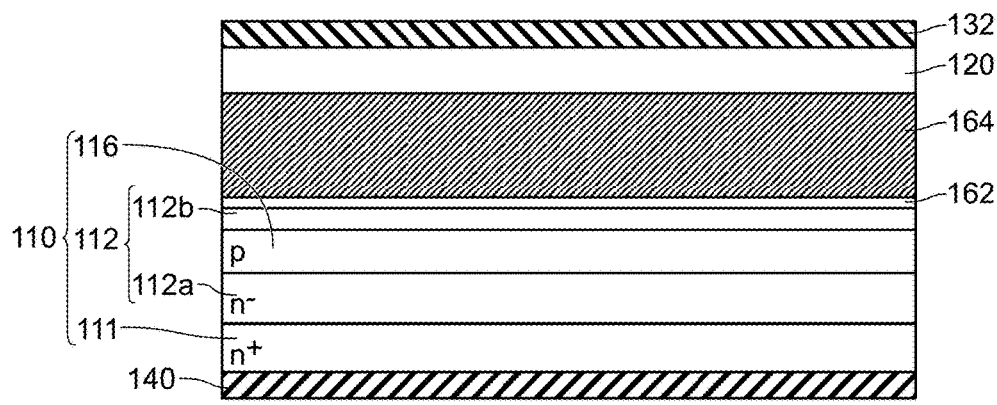

(6) In the above-mentioned respective embodiments, the depth of the peripheral trench 160 is set equal to the depth of the trench 150. However, the present invention is not limited to such a configuration. The depth of the peripheral trench 160 may be set larger than the depth of the trench 150 (a semiconductor device 107 according to a modification 5, see FIG. 17A to FIG. 17C).

Figure 18A:
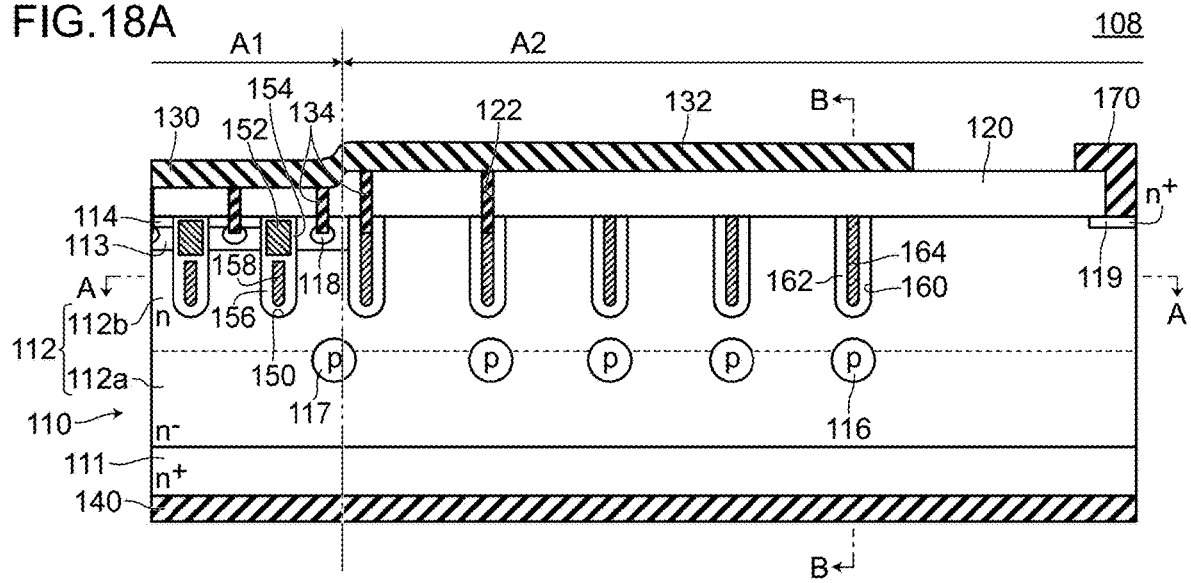
FIG. 18A to FIG. 18C are views showing a semiconductor device 108 according to a modification 6.
Figure 18B:
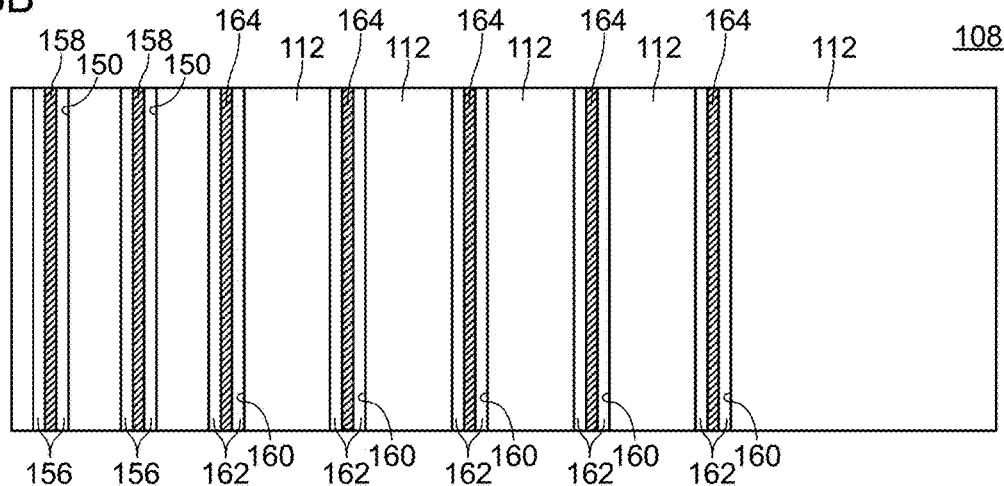
Figure 18C:
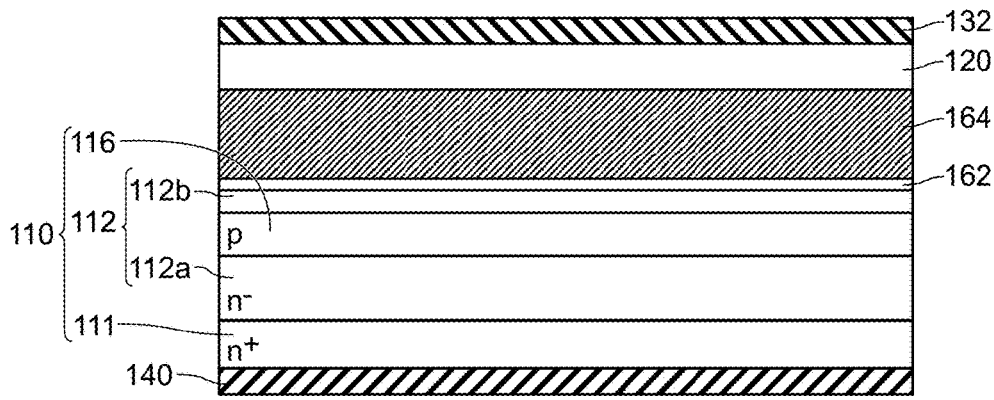

(7) In the above-mentioned respective embodiments, the distance between the peripheral trenches is made different between the active region side and the outer peripheral side. However, the present invention is not limited to such a configuration. The distance between the peripheral trenches may be set equal between the active region side and the outer peripheral side (a semiconductor device 108 according to a modification 6, see FIG. 18A to FIG. 18C).

(8) In the above-mentioned embodiment 3, the surface semiconductor layers 115 are formed in all areas each disposed between the peripheral trenches disposed adjacently to each other. However, the present invention is not limited to such a configuration. It is sufficient that the surface semiconductor layer 115 be disposed at least one area among the areas each formed between the peripheral trenches 160 disposed adjacently to each other. Further, the surface semiconductor layer may be formed outside the peripheral trench 160 on the outermost periphery among the peripheral trenches 160.

Figure 19A:
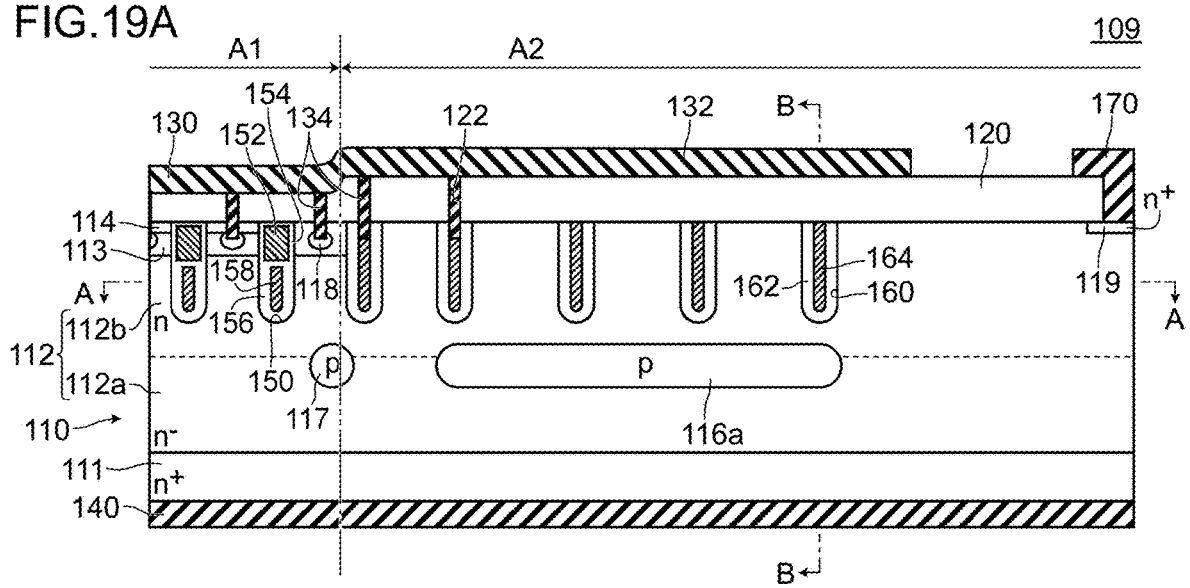
FIG. 19A to FIG. 19C are views showing a semiconductor device 109 according to a modification 7.
Figure 19B:
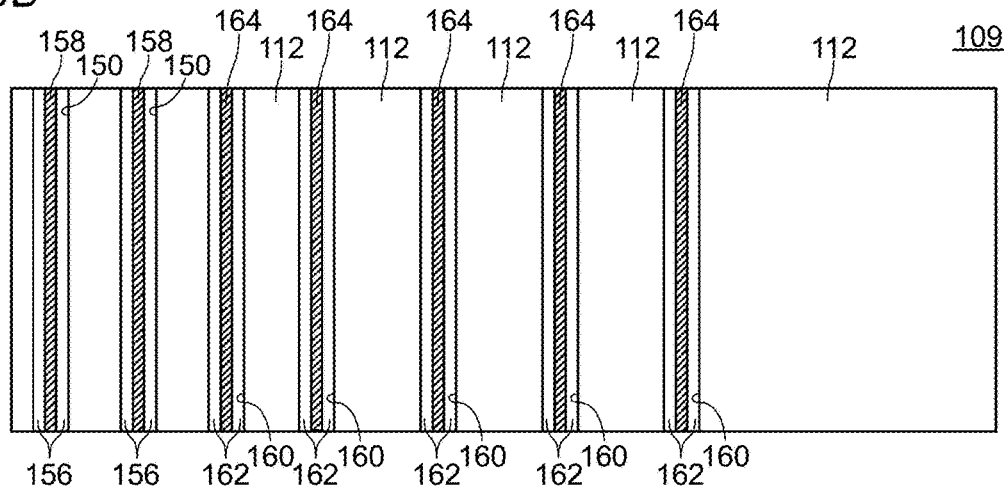
Figure 19C:
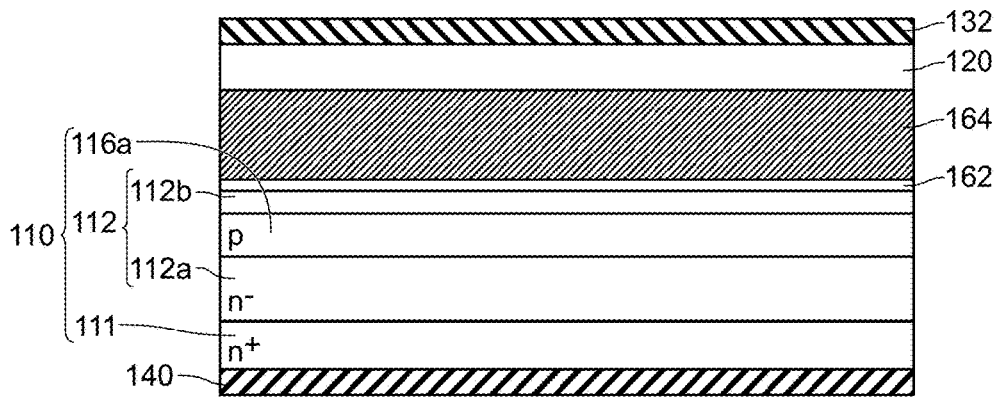
Figure 20:
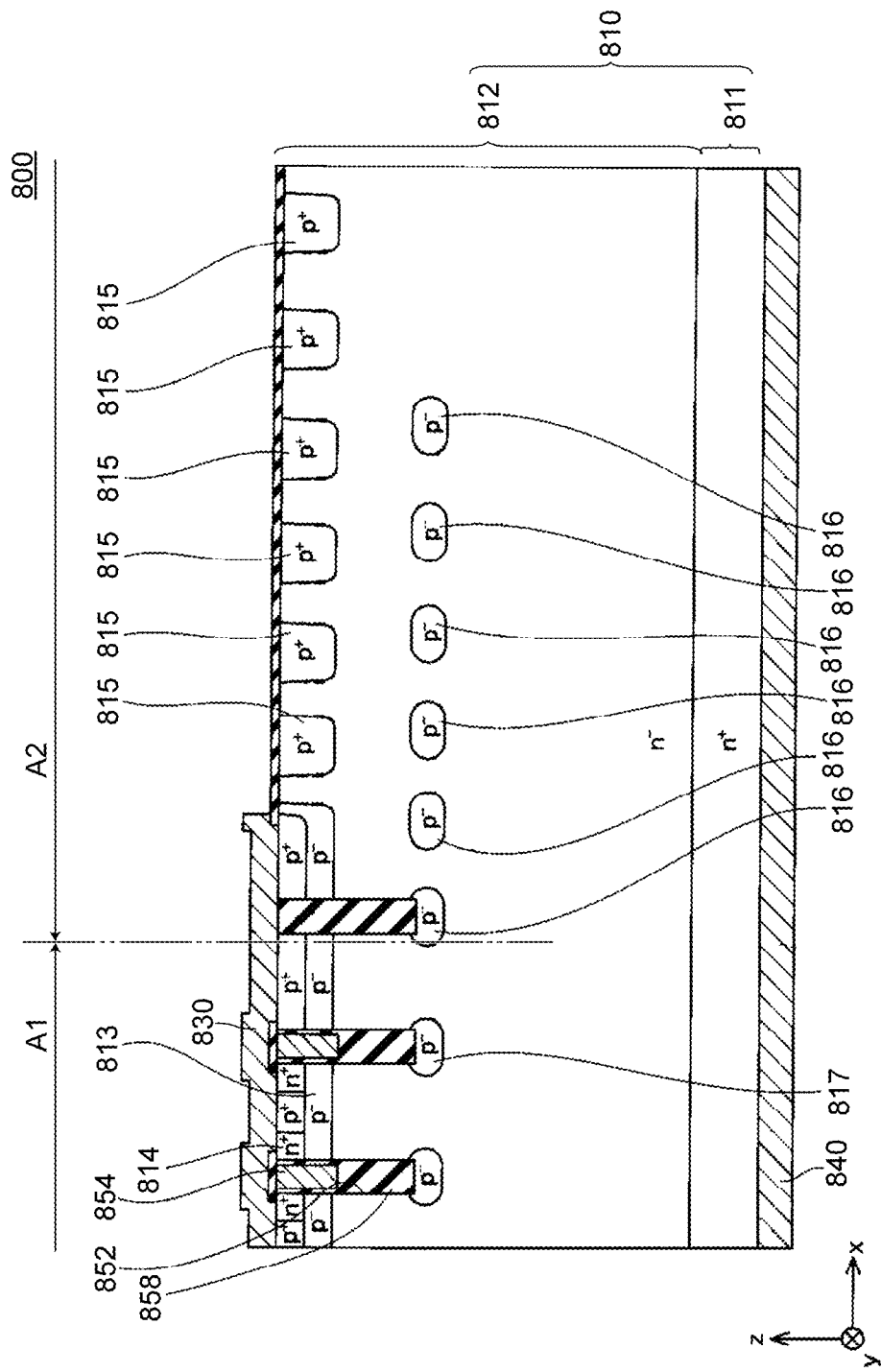
FIG. 20 is a cross-sectional view showing a conventional semiconductor device 800.
Figure 21:
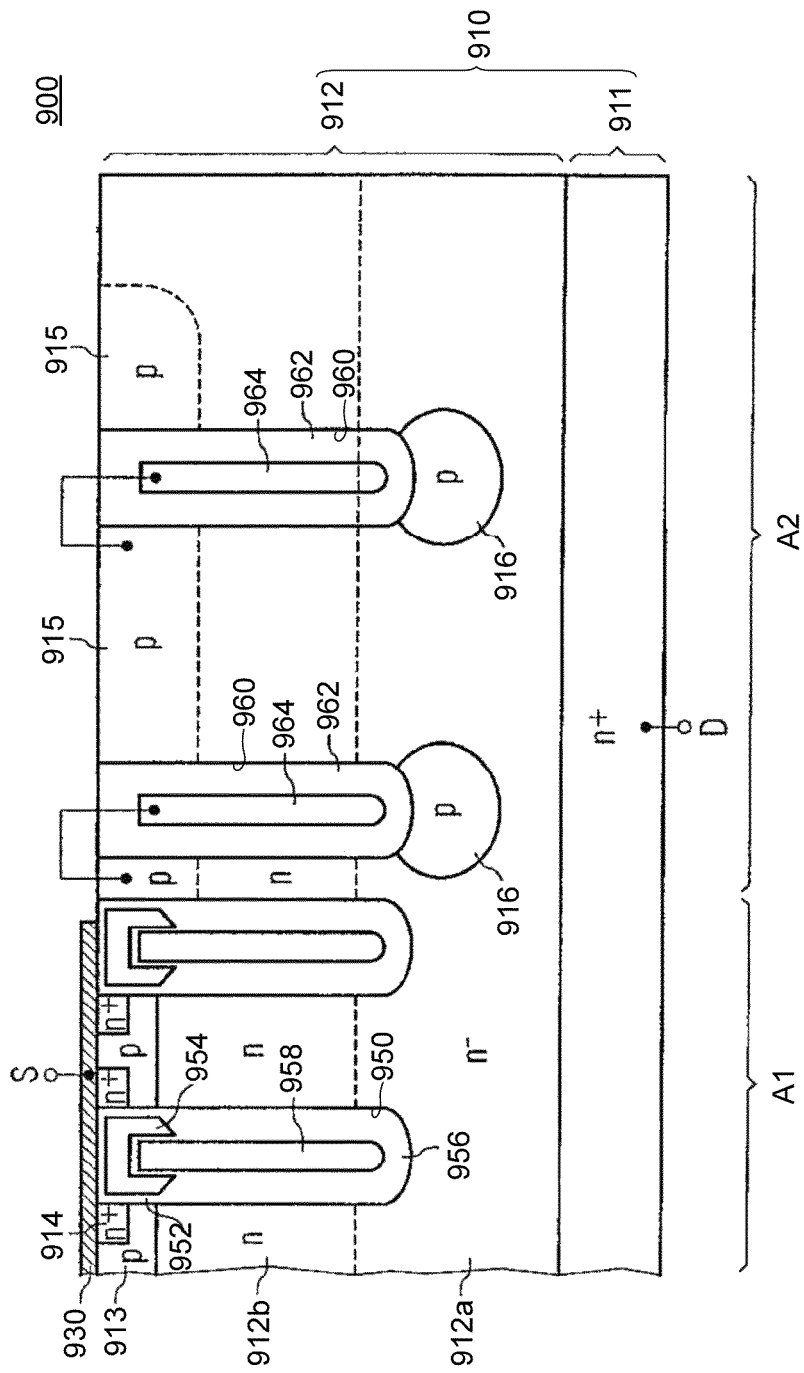
FIG. 21 is a cross-sectional view showing other conventional semiconductor device 900.
Figure 22A:
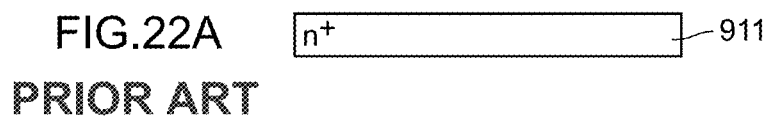
FIG. 22A to FIG. 22F are views showing a method of manufacturing the other conventional semiconductor device.
Figure 22B:
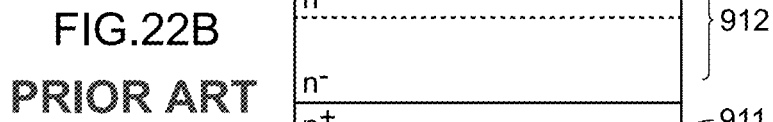
Figure 22C:
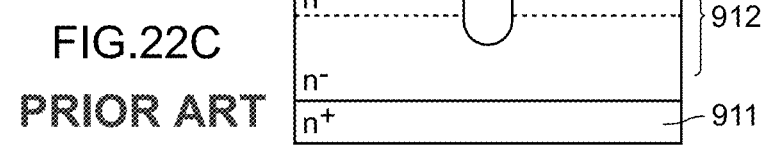
Figure 22D:
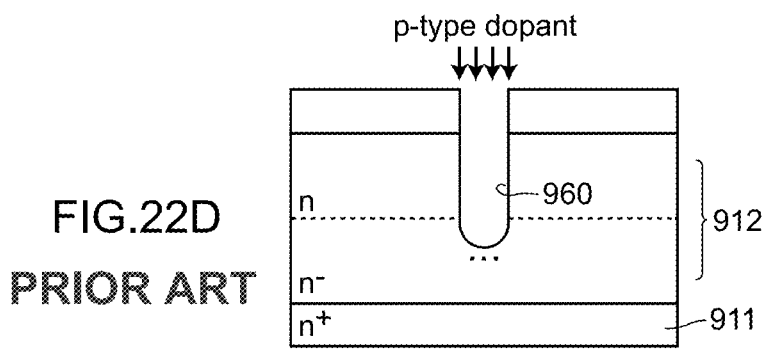
Figure 22E:
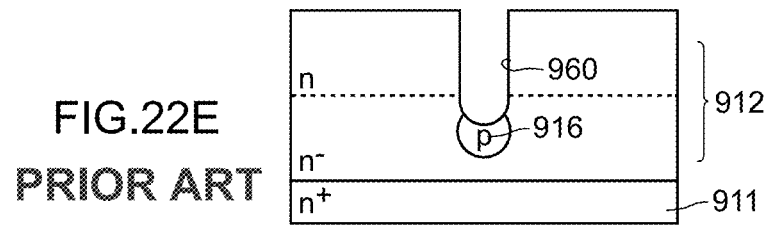
Figure 22F:
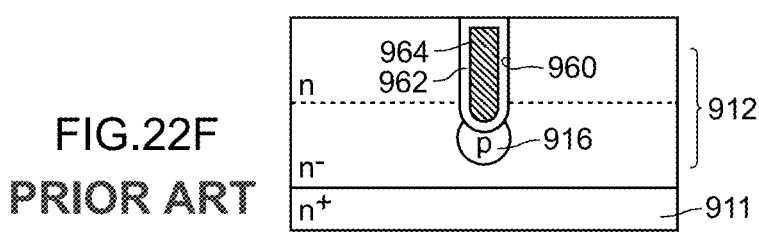

(9) In the above-mentioned respective embodiments, the plurality of floating regions are formed as the floating region. However, the present invention is not limited to such a configuration. A single (one) floating region may be formed as the floating region (a semiconductor device 109 according to a modification 7, see a floating region 116a shown in FIG. 19A). In such a configuration, the floating region 116a may be formed in a state where the floating region 116a extends to the outside of a peripheral trench 160 on an outermost periphery.

What is claimed is:

1. A semiconductor device, comprising:
   a semiconductor base substrate including a first conductive type semiconductor layer;
   a first main electrode formed on one surface side of the semiconductor base substrate;
   a second main electrode formed on an other surface side of the semiconductor base substrate on a side opposite to the one surface;
   three or more peripheral trenches formed on a surface of the semiconductor layer and having bottom portions covered by the semiconductor layer in a peripheral region outside an active region where a main current path is formed between the first main electrode and the second main electrode;
   three or more in-trench electrodes each embedded in each of the three or more peripheral trenches by way of an insulation layer formed on an inner surface of the each of the three or more peripheral trenches; and
   two or more active trenches formed on the surface of the semiconductor layer and having bottom portions covered by the semiconductor layer in the active region,
   wherein
   a thickness of the insulation layer is greater than a thickness of a gate insulation film in the active region where the main current path is formed,
   the semiconductor base substrate further includes, in the peripheral region, a plurality of second conductive type floating regions disposed in the semiconductor layer at a depth position deeper than the bottom portions of the peripheral trenches in a spaced apart manner from the peripheral trenches and having a potential in a floating state,
   a lowermost portion of all of the plurality of peripheral trenches is in direct contact with the first conductive type semiconductor layer,
   (1) two of the three or more in-trench electrodes embedded in respective two of the three or more peripheral trenches closer to the active region than the other of the three or more peripheral trenches are connected with the first main electrode,
   (2) the other of the three or more in-trench electrodes embedded in the other of the three or more peripheral trenches than the two peripheral trenches closer to the active region has a potential in a floating state, and
   (3) a distance A between one of the two or more active trenches closest to the peripheral region and one of the three or more peripheral trenches closest to the active region is the same as a distance B between the adjacent two of the two or more active trenches and narrower than a distance C between the adjacent two of the three or more peripheral trenches.

2. The semiconductor device according to claim 1, wherein the semiconductor base substrate includes a plurality of the floating regions disposed in a spaced apart manner from each other as the floating regions.

3. The semiconductor device according to claim 1, wherein the floating regions are disposed in a region where the peripheral trenches are disposed as viewed in a plan view.

4. The semiconductor device according to claim 3, wherein the floating region is disposed also outside the region where the peripheral trenches are disposed as viewed in the plan view.

5. The semiconductor device according to claim 1, wherein the floating region is disposed between the peripheral trenches as viewed in a plan view.

6. The semiconductor device according to claim 1, wherein the semiconductor device further comprises, in the active region, a plurality of trenches formed on the semiconductor layer, a plurality of gate electrodes each formed in each of the plurality of trenches by way of a side wall of the trench and a gate insulation film, a plurality of shield electrodes each positioned between a bottom of the trench and the gate electrode, and a plurality of insulation regions each extending between the gate electrode and the shield electrode, and further extending along the side wall and the bottom of the trench thus making the shield electrode spaced apart from the side wall and the bottom, and
   a depth of the peripheral trench is equal to a depth of the trench.

7. The semiconductor device according to claim 1, wherein the semiconductor base substrate further includes, on a surface of the semiconductor layer in the peripheral region, a second conductive type surface semiconductor layer disposed at least one portion between the peripheral trenches disposed adjacently to each other and having higher dopant concentration than the floating region.

8. The semiconductor device according to claim 1, wherein the semiconductor device further comprises a further semiconductor layer of the first conductive type between the second main electrode and the semiconductor base substrate, and the further semiconductor layer has a resistance lower than the first conductive type semiconductor layer.

9. The semiconductor device according to claim 1, wherein a portion of the first conductive type semiconductor layer is disposed between the second conductive type floating regions and the second main electrode.

10. A semiconductor device, comprising:

a semiconductor base substrate having a first conductive type semiconductor layer;

a first main electrode formed on one surface side of the semiconductor base substrate;

a second main electrode formed on an other surface side of the semiconductor base substrate on a side opposite to the one surface;

three or more peripheral trenches formed on a surface of the semiconductor layer and having bottom portions covered by the semiconductor layer in a peripheral region outside an active region where a main current path is formed between the first main electrode and the second main electrode; and three or more in-trench electrodes each embedded in each of the three or more peripheral trenches by way of an insulation layer formed on an inner surface of the each of the three or more peripheral trenches, wherein the semiconductor device further comprises, in the active region, two or more active trenches formed on the semiconductor layer, two or more gate electrodes each formed in each of the two or more active trenches by way of a side wall of the trench and a gate insulation film, two or more shield electrodes each positioned between a bottom of the active trench and the gate electrode, and two or more insulation regions each extending between the gate electrode and the shield electrode, and further extending along the side wall and the bottom of the trench thus making the shield electrode spaced apart from the side wall and the bottom, a thickness of the insulation layer is greater than a thickness of the gate insulation film in the active region where the main current path is formed, the semiconductor base substrate further includes, in the peripheral region, a single or a plurality of second conductive type floating regions disposed in the semiconductor layer at a depth position deeper than the bottom portions of the peripheral trenches in a spaced apart manner from the peripheral trenches and having a potential in a floating state, the semiconductor base substrate further includes, in the active region, a second conductive type base region formed on a surface of the semiconductor layer and being brought into contact with a side wall of the trench, a first conductive type source region formed on a surface of the base region and being brought into contact with the side wall of the trench, and a boundary floating region disposed in the semiconductor layer at a depth position deeper than a bottom portion of the trench in a spaced-apart manner from the trench and having a potential in a floating state, the boundary floating region being, as viewed in a plan view, disposed between the trench closest to the peripheral region among the plurality of trenches in the active region and the peripheral trench closest to the active region among the plurality of peripheral trenches in the peripheral region, a lowermost portion of all of the plurality of peripheral trenches is in direct contact with the first conductive type semiconductor layer, (1) two of the three or more in-trench electrodes embedded in respective two of the three or more peripheral trenches closer to the active region than the other of the three or more peripheral trenches are connected with the first main electrode, (2) the other of the three or more in-trench electrodes embedded in the other of the three or more peripheral trenches than the two peripheral trenches closer to the active region has a potential in a floating state, and (3) a distance between one of the two or more active trenches closest to the peripheral region and one of the three or more peripheral trenches closest to the active region is the same as a distance between the adjacent two of the two or more active trenches and narrower than a distance between the adjacent two of the three or more peripheral trenches.

11. The semiconductor device according to claim 10, wherein the semiconductor base substrate includes a plurality of the floating regions disposed in a spaced apart manner from each other as the floating regions.

12. The semiconductor device according to claim 10, wherein the floating regions are disposed in a region where the peripheral trenches are disposed as viewed in a plan view.

13. The semiconductor device according to claim 12, wherein the floating region is disposed also outside the region where the peripheral trenches are disposed as viewed in the plan view.

14. The semiconductor device according to claim 10, wherein the floating region is disposed between the peripheral trenches as viewed in a plan view.

15. The semiconductor device according to claim 10, wherein a depth of the peripheral trench is equal to a depth of the trench.

16. The semiconductor device according to claim 10, wherein the semiconductor base substrate further includes, on a surface of the semiconductor layer in the peripheral region, a second conductive type surface semiconductor layer disposed at least one portion between the peripheral trenches disposed adjacently to each other and having higher dopant concentration than the floating region.

17. The semiconductor device according to claim 10, wherein the semiconductor device further comprises a further semiconductor layer of the first conductive type between the second main electrode and the semiconductor base substrate, and the further semiconductor layer has a resistance lower than the first conductive type semiconductor layer.

18. The semiconductor device according to claim 10, wherein a portion of the first conductive type semiconductor layer is disposed between the second conductive type floating regions and the second main electrode.

19. A semiconductor device, comprising:

a semiconductor base substrate having a first conductive type semiconductor layer;

a first main electrode formed on one surface side of the semiconductor base substrate;

a second main electrode formed on an other surface side of the semiconductor base substrate on a side opposite to the one surface;

three or more peripheral trenches formed on a surface of the semiconductor layer and having bottom portions covered by the semiconductor layer in a peripheral region outside an active region where a main current path is formed between the first main electrode and the second main electrode; and three or more in-trench electrodes each embedded in each of the three or more peripheral trenches by way of an insulation layer formed on an inner surface of the each of the three or more peripheral trenches, wherein the semiconductor device further comprises, in the active region, two or more active trenches formed on the semiconductor layer, two or more gate electrodes each formed in each of the two or more active trenches by way of a side wall of the trench and a gate insulation film, two or more shield electrodes each positioned between a bottom of the active trench and the gate electrode, and two or more insulation regions each extending between the gate electrode and the shield electrode, and further extending along the side wall and the bottom of the trench thus making the shield electrode spaced apart from the side wall and the bottom, a thickness of the insulation layer being greater than a thickness of a gate insulation film in the active region where the main current path is formed, the semiconductor base substrate further includes, in the peripheral region, a single or a plurality of second conductive type floating regions disposed in the semiconductor layer at a depth position deeper than the bottom portions of the peripheral trenches in a spaced apart manner from the peripheral trenches and having a potential in a floating state, the semiconductor base substrate further includes, in the active region, a second conductive type base region formed on a surface of the semiconductor layer and being brought into contact with a side wall of the trench, a first conductive type source region formed on a surface of the base region and being brought into contact with the side wall of the trench, and a boundary floating region disposed in the semiconductor layer at a depth position deeper than a bottom portion of the trench in a spaced-apart manner from the trench and having a potential in a floating state, the boundary floating region being, as viewed in a plan view, disposed between the trench closest to the peripheral region among the plurality of trenches in the active region and the peripheral trench closest to the active region among the plurality of peripheral trenches in the peripheral region, a lowermost portion of all of the plurality of peripheral trenches is in direct contact with the first conductive type semiconductor layer, a lowermost portion of each of the plurality of trenches in the active region is in direct contact with the first conductive type semiconductor layer, the semiconductor device further comprises a further semiconductor layer of the first conductive type between the second main electrode and the semiconductor base substrate, and the further semiconductor layer has a resistance lower than the first conductive type semiconductor layer, (1) two of the three or more in-trench electrodes embedded in respective two of the three or more peripheral trenches closer to the active region than the other of the three or more peripheral trenches are connected with the first main electrode, (2) the other of the three or more in-trench electrodes embedded in the other of the three or more peripheral trenches than the two peripheral trenches closer to the active region has a potential in a floating state, and (3) a distance between one of the two or more active trenches closest to the peripheral region and one of the three or more peripheral trenches closest to the active region is the same as a distance between the adjacent two of the two or more active trenches and narrower than a distance between the adjacent two of the three or more peripheral trenches.

* * * * *